United States Patent
Choi et al.

(10) Patent No.: US 10,643,705 B2
(45) Date of Patent: May 5, 2020

(54) CONFIGURABLE PRECISION NEURAL NETWORK WITH DIFFERENTIAL BINARY NON-VOLATILE MEMORY CELL STRUCTURE

(71) Applicant: SanDisk Technologies LLC, Addison, TX (US)

(72) Inventors: Won Ho Choi, San Jose, CA (US); Pi-Feng Chiu, Milpitas, CA (US); Wen Ma, Sunnyvale, CA (US); Martin Lueker-Boden, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/414,143

(22) Filed: May 16, 2019

(65) Prior Publication Data

US 2020/0035305 A1    Jan. 30, 2020

Related U.S. Application Data

(63) Continuation-in-part of application No. 16/405,178, filed on May 7, 2019.
(Continued)

(51) Int. Cl.
*G11C 7/22* (2006.01)
*G11C 16/08* (2006.01)
(Continued)

(52) U.S. Cl.
CPC .............. *G11C 16/08* (2013.01); *G06F 17/16* (2013.01); *G06N 3/063* (2013.01); *G06N 3/08* (2013.01)

(58) Field of Classification Search
CPC ......... G11C 16/08; G06F 17/16; G06N 3/063; G06N 3/08
(Continued)

(56) References Cited

U.S. PATENT DOCUMENTS 7,324,366 B2    1/2008  Bednorz et al.
7,505,347 B2    3/2009  Rinerson et al.
(Continued)

FOREIGN PATENT DOCUMENTS

CN    110597555 A    12/2019
CN    110598858 A    12/2019

OTHER PUBLICATIONS

Rastegari, Mohammad et al., "XNOR-Net: ImageNet Classification Using Binary Convolutional Neural Networks," proceedings ECCV 2016, Aug. 2016, 55 pages.
(Continued)

*Primary Examiner* — Huan Hoang
(74) *Attorney, Agent, or Firm* — Vierra Magen Marcus LLP

(57) ABSTRACT

Use of a non-volatile memory array architecture to realize a neural network (BNN) allows for matrix multiplication and accumulation to be performed within the memory array. A unit synapse for storing a weight of a neural network is formed by a differential memory cell of two individual memory cells, such as a memory cells having a programmable resistance, each connected between a corresponding one of a word line pair and a shared bit line. An input is applied as a pattern of voltage values on word line pairs connected to the unit synapses to perform the multiplication of the input with the weight by determining a voltage level on the shared bit line. The results of such multiplications are determined by a sense amplifier, with the results accumulated by a summation circuit. The approach can be extended from binary weights to multi-bit weight values by use of multiple differential memory cells for a weight.

20 Claims, 24 Drawing Sheets

US 10,643,705 B2
Page 2

Related U.S. Application Data

(60) Provisional application No. 62/702,713, filed on Jul. 24, 2018.

(51) Int. Cl.
  *G06N 3/08* (2006.01)
  *G06N 3/063* (2006.01)
  *G06F 17/16* (2006.01)

(58) Field of Classification Search
  USPC .................................................. 365/189.011
  See application file for complete search history.

(56) References Cited

U.S. PATENT DOCUMENTS

| | | | |
|---|---|---|---|
| 8,416,624 B2 * | 4/2013 | Lei | G11C 16/3404 365/185.17 |
| 8,634,247 B1 | 1/2014 | Sprouse et al. | |
| 8,634,248 B1 | 1/2014 | Sprouse et al. | |
| 8,773,909 B2 | 7/2014 | Li et al. | |
| 8,780,632 B2 | 7/2014 | Sprouse et al. | |
| 8,780,633 B2 | 7/2014 | Sprouse et al. | |
| 8,780,634 B2 | 7/2014 | Sprouse et al. | |
| 8,780,635 B2 | 7/2014 | Li et al. | |
| 8,792,279 B2 | 7/2014 | Li et al. | |
| 8,811,085 B2 | 8/2014 | Sprouse et al. | |
| 8,817,541 B2 | 8/2014 | Li et al. | |
| 9,098,403 B2 | 8/2015 | Sprouse et al. | |
| 9,104,551 B2 | 8/2015 | Spouse et al. | |
| 9,116,796 B2 | 8/2015 | Sprouse et al. | |
| 9,384,126 B1 | 7/2016 | Sprouse et al. | |
| 9,430,735 B1 | 8/2016 | Vali et al. | |
| 9,887,240 B2 | 2/2018 | Shimabukuro et al. | |
| 10,127,150 B2 | 11/2018 | Sprouse et al. | |
| 10,459,724 B2 | 10/2019 | Yu et al. | |
| 10,535,391 B2 | 1/2020 | Osada et al. | |
| 2014/0133228 A1 | 5/2014 | Sprouse et al. | |
| 2014/0133233 A1 | 5/2014 | Li et al. | |
| 2014/0133237 A1 | 5/2014 | Sprouse et al. | |
| 2014/0136756 A1 | 5/2014 | Sprouse et al. | |
| 2014/0136757 A1 | 5/2014 | Sprouse et al. | |
| 2014/0136758 A1 | 5/2014 | Sprouse et al. | |
| 2014/0136760 A1 | 5/2014 | Sprouse et al. | |
| 2014/0136762 A1 | 5/2014 | Li et al. | |
| 2014/0136763 A1 | 5/2014 | Li et al. | |
| 2014/0136764 A1 | 5/2014 | Li et al. | |
| 2014/0156576 A1 | 6/2014 | Nugent | |
| 2014/0136761 A1 | 7/2014 | Li et al. | |
| 2014/0294272 A1 | 10/2014 | Madabhushi et al. | |
| 2015/0324691 A1 | 11/2015 | Droops et al. | |
| 2016/0026912 A1 | 1/2016 | Falcon et al. | |
| 2017/0098156 A1 | 4/2017 | Nino et al. | |
| 2017/0228637 A1 | 8/2017 | Santoro et al. | |
| 2018/0039886 A1 | 2/2018 | Umuroglu et al. | |
| 2018/0075339 A1 | 3/2018 | Ma et al. | |
| 2018/0144240 A1 | 5/2018 | Garbin et al. | |
| 2019/0251425 A1 | 8/2019 | Jaffari et al. | |

OTHER PUBLICATIONS

Wan, Diwen, et al., "TBN: Convolutional Neural Network with Ternary Inputs and Binary Weights," ECCV 2018, Oct. 2018, 18 pages.
Chen, Yu-Hsin, et al., "Eyeriss: An Energy-Efficient Reconfigurable Accelerator for Deep Convolutional Neural Networks," IEEE Journal of Solid-State Circuits, Feb. 2016, 12 pages.
Sun, Xiaoyu, et al., "Fully Parallel RRAM Synaptic Array for Implementing Binary Neural Network with (+1, −1) Weights and (+1, 0) Neurons," 23rd Asia and South Pacific Design Automation Conference, Jan. 2018, 6 pages.
Gonugondla, Sujan K., et al., "Energy-Efficient Deep In-memory Architecture for NAND Flash Memories," IEEE International Symposium on Circuits and Systems (ISCAS), May 2018, 5 pages.
Nakahara, Hiroki, et al., "A Memory-Based Realization of a Binarized Deep Convolutional Neural Network," International Conference on Field-Programmable Technology (FPT), Dec. 2016, 4 pages.
Takeuchi, Ken, "Data-Aware NAND Flash Memory for Intelligent Computing with Deep Neural Network," IEEE International Electron Devices Meeting (IEDM), Dec. 2017, 4 pages.
Mochida, Reiji, et al., "A 4M Synapses integrated Analog ReRAM based 66.5 TOPS/W Neural-Network Processor with Cell Current Controlled Writing and Flexible Network Architecture," Symposium on VLSI Technology Digest of Technical Papers, Jun. 2018, 2 pages.
Chiu, Pi-Feng, et al., "A Differential 2R Crosspoint RRAM Array With Zero Standby Current," IEEE Transactions on Circuits and Systems—II: Express Briefs, vol. 62, No. 5, May 2015, 5 pages.
Chen, Wei-Hao, et al., "A 65nm 1Mb Nonvolatile Computing-in-Memory ReRAM Macro with Sub-16ns Mulitply-and-Accumulate for Binary DNN AI Edge Processors," IEEE International Solid-State Circuits Conference, Feb. 2018, 3 pages.
Liu, Rui, et al., "Parallelizing SRAM Arrays with Customized Bit-Cell for Binary Neural Networks," DAC '18, Jun. 2018, 6 pages.
Courbariaux, Matthieu, et al., "Binarized Neural Networks: Training Neural Networks with Weights and Activations Constrained to +1 or −1," arXiv.org, Mar. 2016, 11 pages.
U.S. Appl. No. 62/702,713, filed Jul. 24, 2018.
U.S. Appl. No. 16/052,420, filed Aug. 1, 2018.
U.S. Appl. No. 16/368,441, filed Mar. 28, 2019.
U.S. Appl. No. 16/368,347, filed Mar. 28, 2019.
U.S. Appl. No. 16/405,178, filed May 7, 2019.
Zheng, Shixuan, et al., "An Efficient Kernel Transformation Architecture for Binary-and Ternary-Weight Neural Network Inference," DAC' 18, Jun. 24-29, 2018, 6 pages.
Notice of Allowance dated Feb. 20, 2020, U.S. Appl. No. 16/405,178, filed May 7, 2019.
Resch, Salonik, et al., "PIMBALL: Binary Neural Networks in Spintronic Memory," ACM Trans. Arch. Code Optim., vol. 37, No. 4, Article 111, Aug. 2018, 25 pages.
Zamboni, Maurizio, et al., "In-Memory Binary Neural Networks," Master's Thesis, Politecino Di Torino, Apr. 10, 2019, 327 pages.
Natsui, Masanori, et al., "Design of an energy-efficient XNOR gate based on MTJ-based nonvolatile logic-in-memory architecture for binary neural network hardware," Japanese Journal of Applied Physics 58, Feb. 2019, 8 pages.
U.S. Appl. No. 16/653,346, filed Oct. 15, 2019.
U.S. Appl. No. 16/653,365, filed Oct. 15, 2019.
Simon, Noah, et al., "A Sparse-Group Lasso," Journal of Computational and Graphical Statistics, vol. 22, No. 2, pp. 231-245, downloaded by Moskow State Univ. Bibliote on Jan. 28, 2014.
"CS231n Convolutional Neural Networks for Visual Recognition," [cs231.github.io/neural-networks-2/#reg], downloaded on Oct. 15, 2019, pp. 1-15.
Krizhevsky, Alex, et al., "ImageNet Classification with Deep Convolutional Neural Networks," [http://code.google.com/p/cuda-convnet/], downloaded on Oct. 15, 2019, 9 pages.
Shafiee, Ali, et al., "ISAAC: A Convolutional Neural Network Accelerator with In-Situ Analog Arithmetic in Crossbars," ACM/IEEE 43rd Annual International Symposium on Computer Architecture (ISCA), Oct. 5, 2016, 13 pages.
Han, Song, et al., "Learning both Weights and Connections for Efficient Neural Networks," Conference paper, NIPS, Oct. 2015, 9 pages.
Jia, Yangqing, "Learning Semantic Image Representations at a Large Scale," Electrical Engineering and CS, University of Berkeley, Technical Report No. UCB/EECS-2014-93, May 16, 2014, 104 pages.
Wen, Wei, et al., "Learning Structured Sparsity in Deep Neural Networks," 30th Conference on Neural Information Processing Systems (NIPS 2016), Nov. 2016, 9 pages.
Wang, Peiqi, et al., "SNrram: An Efficient Sparse Neural Network Computation Architecture Based on Resistive Random-Access Memory," DAC '18, Jun. 24-29, 2018, 6 pages.

* cited by examiner

| Input (IN) | Weight (W) | Output (IN*W) |
|---|---|---|
| -1 | -1 | +1 |
| -1 | +1 | -1 |
| +1 | -1 | -1 |
| +1 | +1 | +1 |

| In | WL | WLB | W | $R_A$ | $R_B$ | $V_O$ | O |
|---|---|---|---|---|---|---|---|
| -1 | 0 | V | +1 | LRS | HRS | $V_L$ | -1 |
| +1 | V | 0 | +1 | LRS | HRS | $V_H$ | +1 |
| -1 | 0 | V | -1 | HRS | LRS | $V_H$ | +1 |
| +1 | V | 0 | -1 | HRS | LRS | $V_L$ | -1 |
Figure 11
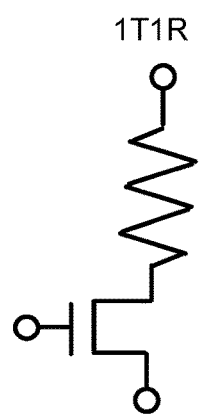
1T1R
Figure 13A
1S1R
Figure 13B
1R
Figure 13C

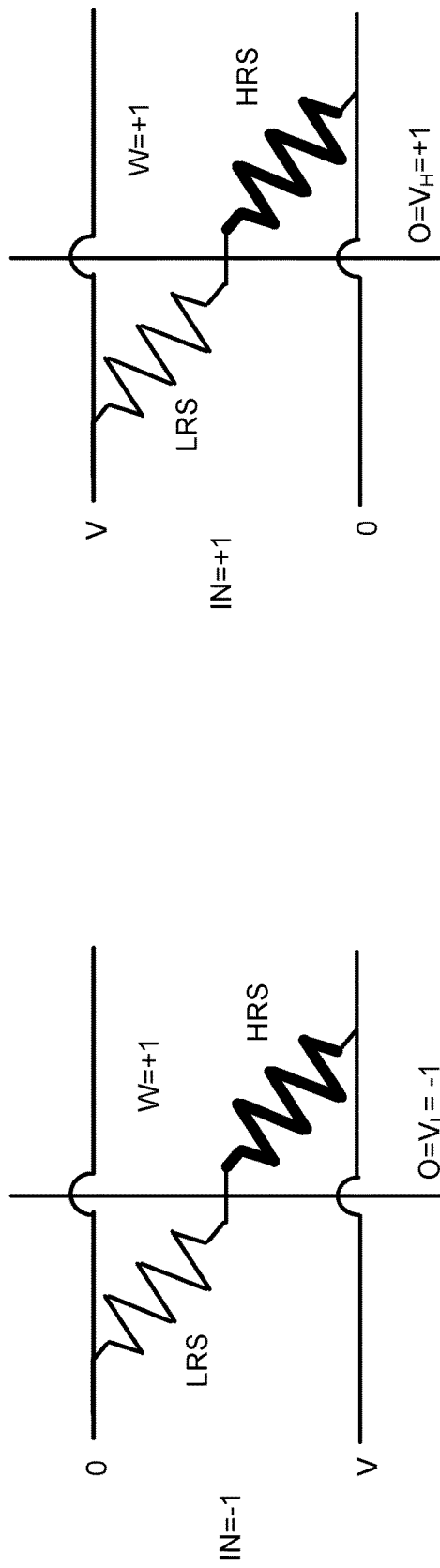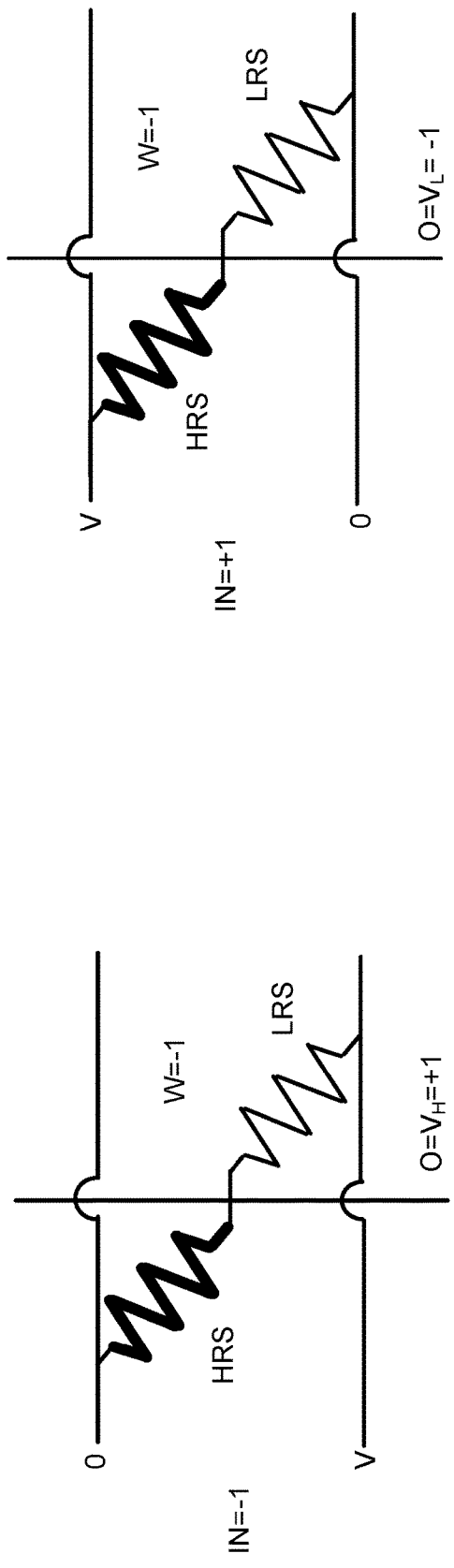
Figure 12A  Figure 12B  Figure 12C  Figure 12D $In_{l+1,j} = O_{l,j} = \sum_i In_{l,i} * W_{l,i,j}$

CONFIGURABLE PRECISION NEURAL NETWORK WITH DIFFERENTIAL BINARY NON-VOLATILE MEMORY CELL STRUCTURE

CROSS-REFERENCE TO RELATED APPLICATIONS

This application is a Continuation-in-Part of U.S. patent application Ser. No. 16/405,178, filed May 7, 2019, which claims priority from U.S. Provisional Application No. 62/702,713, filed Jul. 24, 2018, and is related to U.S. patent application Ser. Nos. 16/368,441 and 16/368,347, both filed Mar. 28, 2019, all of which are incorporated herein by reference.

BACKGROUND

Artificial neural networks are finding increasing usage in artificial intelligence and machine learning applications. In an artificial neural network, a set of inputs is propagated through one or more intermediate, or hidden, layers to generate an output. The layers connecting the input to the output are connected by sets of weights that are generated in a training or learning phase by determining a set of a mathematical manipulations to turn the input into the output, moving through the layers calculating the probability of each output. Once the weights are established, they can be used in the inference phase to determine the output from a set of inputs. Although such neural networks can provide highly accurate results, they are extremely computationally intensive, and the data transfers involved in reading the weights connecting the different layers out of memory and transferring them into the processing units of a processing unit can be quite intensive.

BRIEF DESCRIPTION OF THE DRAWING

Like-numbered elements refer to common components in the different figures.

FIG. 11 illustrates the encoding of the input values, weight values, and output values as word line voltages, resistance values, and bit line voltages, respectively.

FIGS. 12A-12D respectively correspond to the four cases illustrated in the table of FIG. 11.

FIGS. 13A-13C illustrate some embodiments for the resistive memory cells of the unit synapse.

DETAILED DESCRIPTION

Figure 1:
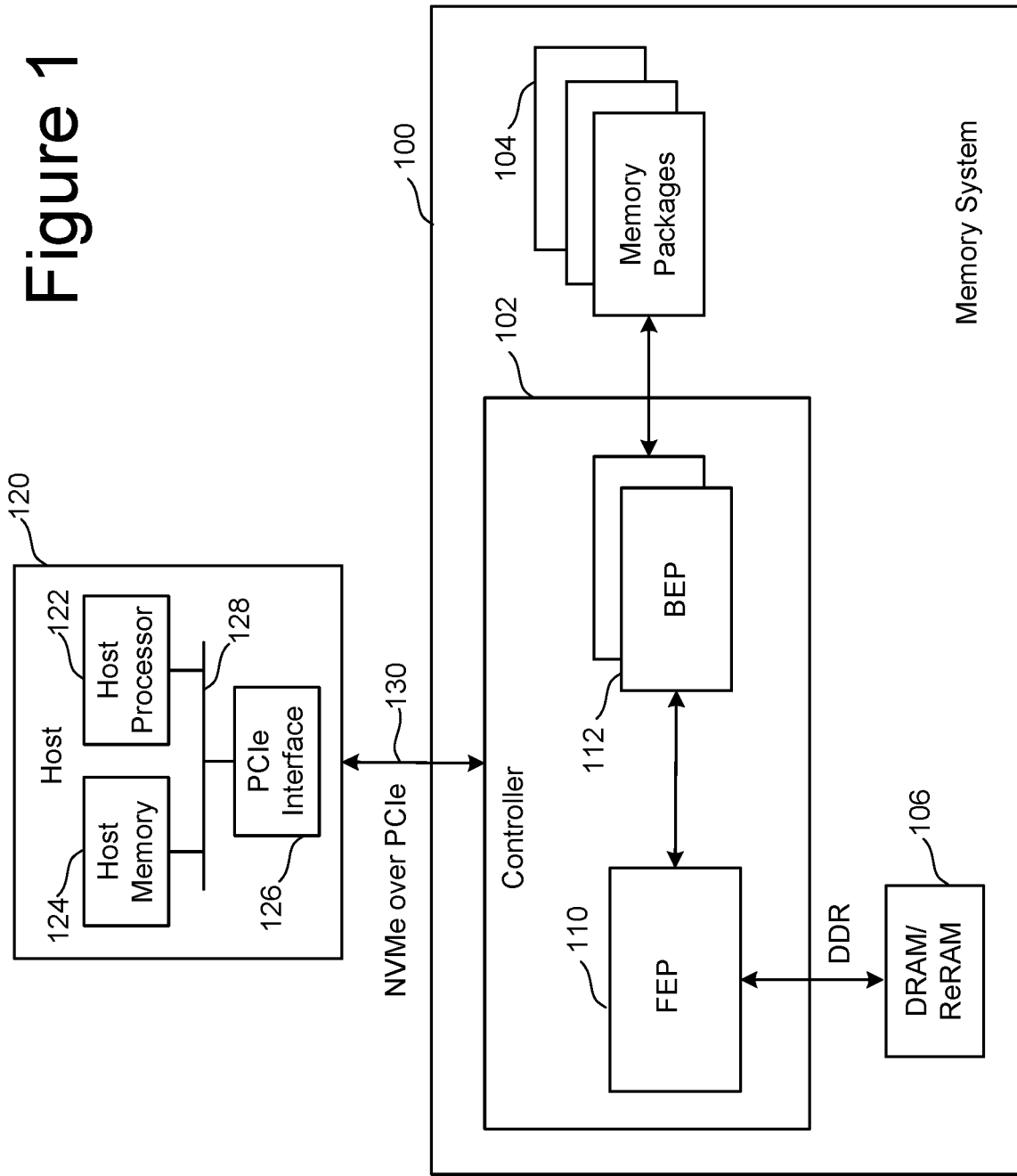
FIG. 1 is a block diagram of one embodiment of a memory system connected to a host.

To reduce the computational complexity and relax the memory requirements of neural networks, Binary Neural Networks (BNNs) have been introduced. In BNNs, the weights and inputs of the neural network are truncated into binary values (−1, +1) and the binary arithmetic simplifies multiplication and addition to XNOR and bit-count operations. The following disclosure presents techniques for exploiting the structure non-volatile memories having a cross-point type of structure for the storage of the weights of the neural networks and for the execution of the multiply-and-accumulation operations within the memory array.

Each weight of a neural network is stored in a unit synapse formed of a pair of resistive non-volatile memory cells in a differential memory cell arrangement, where each of the two memory cells of the pair is connected between a corresponding one of a word line pair and a shared bit line. To store a binary weight on a unit synapse, for example, one of the pair of memory cells is programmed to a high resistance state and the other is programmed to a low resistance state, so that the unit synapse functions as a voltage divider when a voltage pattern is applied to the word line pair. Depending on which memory cell of the unit synapse is in the high resistance state and which memory cell is in the low resistance state, the unit synapse will correspond to a −1 weight value or a +1 weight value. The binary input is then applied as a voltage pattern on the corresponding word line pair, in which one of the word line pair is at a high voltage level and the other one of the word line pair is at a low voltage level, such as ground. Depending on which word line of the word line pair is at which value, the input will either be a −1 or +1 input. By applying the input to the word line pair, the unit synapse will function as a voltage divider and set either a high voltage level or low voltage level on the shared bit line, depending whether or not the input and the weight match. The result can be determined by a multi-level sense amplifier or analog-to-digital converter (ADC) connected to the corresponding bit line. By sequentially working through the input/unit synapse pairs along a bit line and accumulating the results of the sense amplifier, the multiply—and accumulate operations of propagating an input through a layer of a neural network can be performed. As the word lines of the array span multiple bit lines, the operation can be performed concurrently for the binary weights of multiple unit synapses.

The approach can be extended to embodiments using multi-bit weight values for higher precision. For storing an N-bit weight value, each of the N bits can be stored in a differential memory cells connected along a common word line pair, but each on a separate bit line. In an inferencing operation, the input is applied to the weight by the word line pair and the bit-wise output is generated on the bit lines of the weight's differential memory cells. The outputs are then weighted according to their significance, combined, and the combined output is determined by a multi-bit sense amplifier or analog to digital converter.

FIG. 1 is a block diagram of one embodiment of a memory system 100 connected to a host 120. Memory system 100 can implement the technology proposed herein, where the neural network inputs or other data are received from the host 120. Depending on the embodiment, the inputs can be received from the host 120 and then provided to the memory packages 104 for inferencing on the weights previously programmed into the memory arrays of the memory packages 104. Many different types of memory systems can be used with the technology proposed herein. Example memory systems include solid state drives ("SSDs"), memory cards and embedded memory devices; however, other types of memory systems can also be used.

Memory system 100 of FIG. 1 comprises a Controller 102, non-volatile memory 104 for storing data, and local memory (e.g. DRAM/ReRAM) 106. Controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the Controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, Controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126 connected along bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 2:
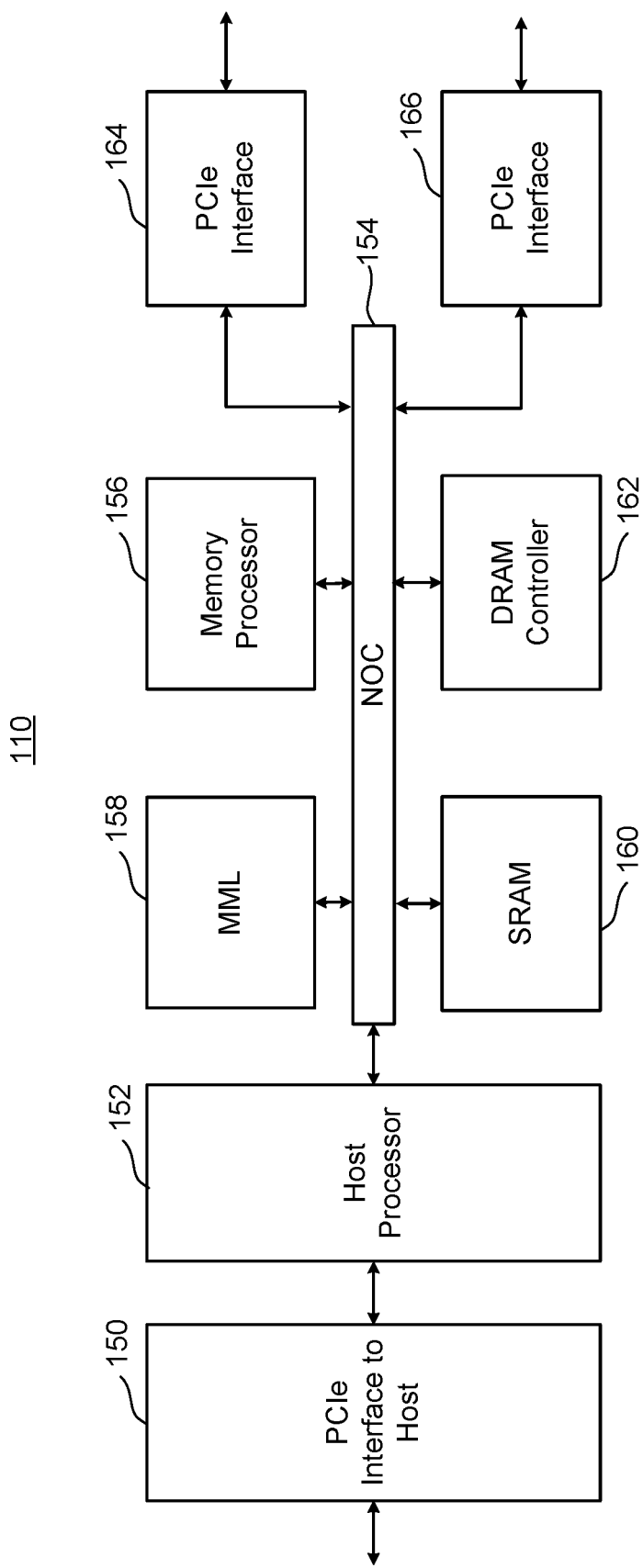
FIG. 2 is a block diagram of one embodiment of a Front End Processor Circuit. In some embodiments, the Front End Processor Circuit is part of a Controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 326 of FIG. 5 below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 3:
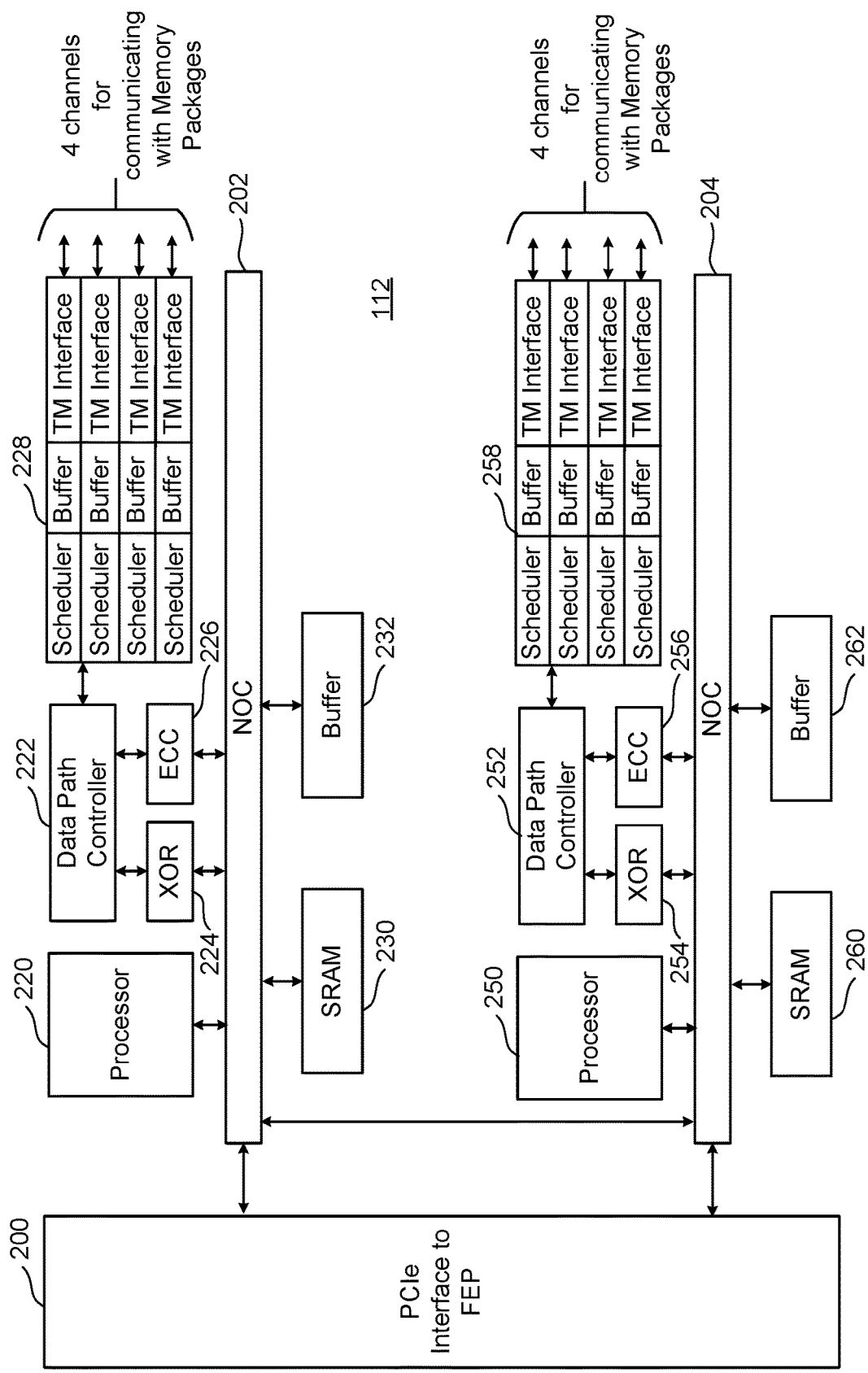
FIG. 3 is a block diagram of one embodiment of a Back End Processor Circuit. In some embodiments, the Back End Processor Circuit is part of a Controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 4:
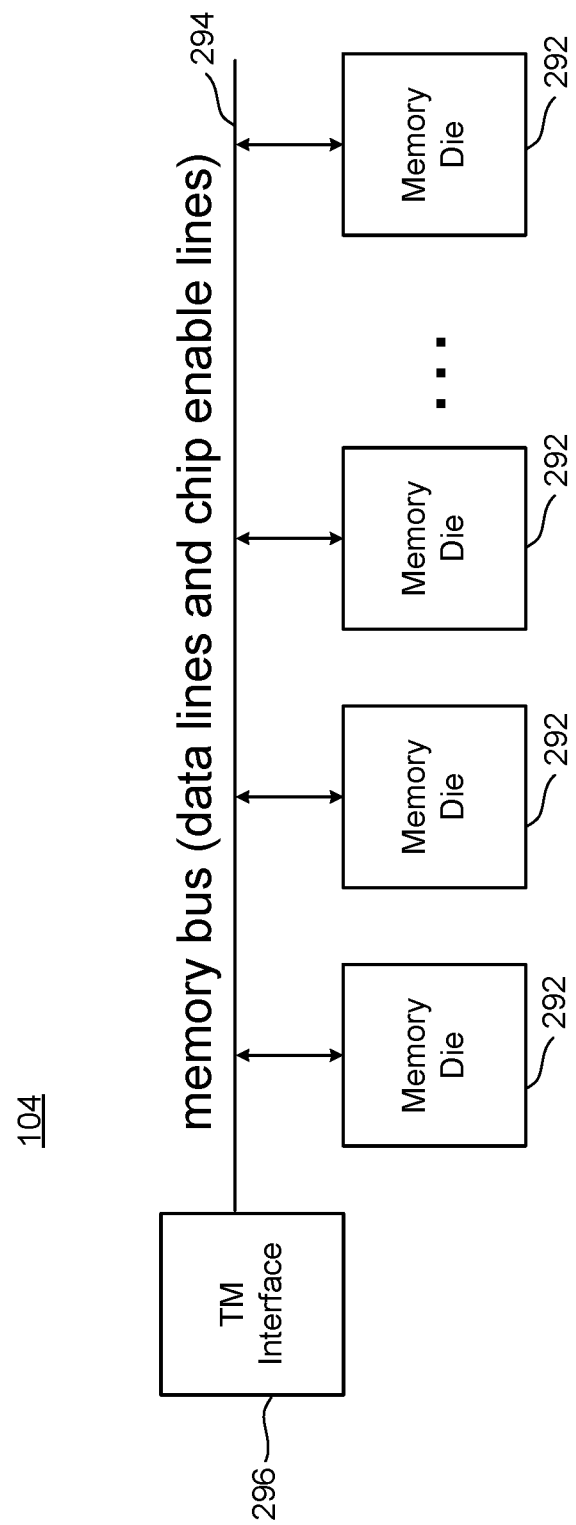
FIG. 4 is a block diagram of one embodiment of a memory package.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 5:
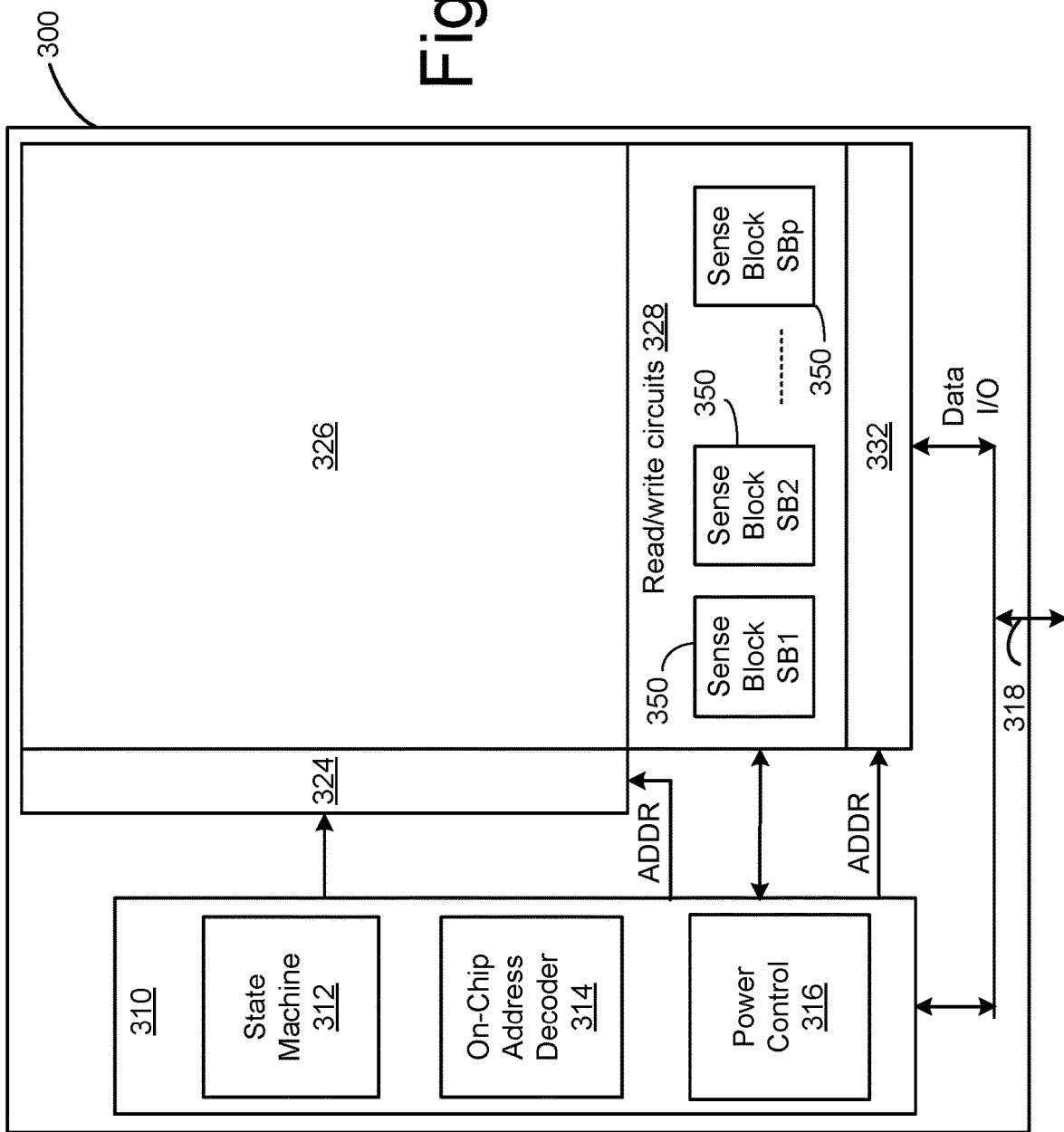
FIG. 5 is a block diagram of one embodiment of a memory die.

FIG. 5 is a functional block diagram of one embodiment of a memory die 300. The components depicted in FIG. 5 are electrical circuits. In one embodiment, each memory die 300 includes a memory structure 326, control circuitry 310, and read/write circuits 328. Memory structure 126 is addressable by word lines via a row decoder 324 and by bit lines via a column decoder 332. The read/write circuits 328 include multiple sense blocks 350 including SB1, SB2, . . . , SBp (sensing circuitry) and allow a page of memory cells to be read or programmed in parallel. Commands and data are transferred between the Controller and the memory die 300 via lines 318. In one embodiment, memory die 300 includes a set of input and/or output (I/O) pins that connect to lines 318.

Control circuitry 310 cooperates with the read/write circuits 328 to perform memory operations (e.g., write, read, and others) on memory structure 326, and includes a state machine 312, an on-chip address decoder 314, and a power control circuit 316. State machine 312 provides die-level control of memory operations. In one embodiment, state machine 312 is programmable by software. In other embodiments, state machine 312 does not use software and is completely implemented in hardware (e.g., electrical circuits). In another embodiment, state machine 312 is replaced by a micro-controller. In one embodiment, control circuitry 310 includes buffers such as registers, ROM fuses and other storage devices for storing default values such as base voltages and other parameters.

The on-chip address decoder 314 provides an address interface between addresses used by Controller 102 to the hardware address used by the decoders 324 and 332. Power control module 316 controls the power and voltages supplied to the word lines and bit lines during memory operations. Power control module 316 may include charge pumps for creating voltages. The sense blocks include bit line drivers.

For purposes of this document, the phrase "one or more control circuits" can refer to a controller, a state machine, a micro-controller and/or control circuitry 310, or other analogous circuits that are used to control non-volatile memory.

In one embodiment, memory structure 326 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include ReRAM memories (resistive random access memories), magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two dimensional arrays, three dimensional arrays, cross-point arrays, stacked two dimensional arrays, vertical bit line arrays, and the like.

One example of a ReRAM, or PCM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 6:
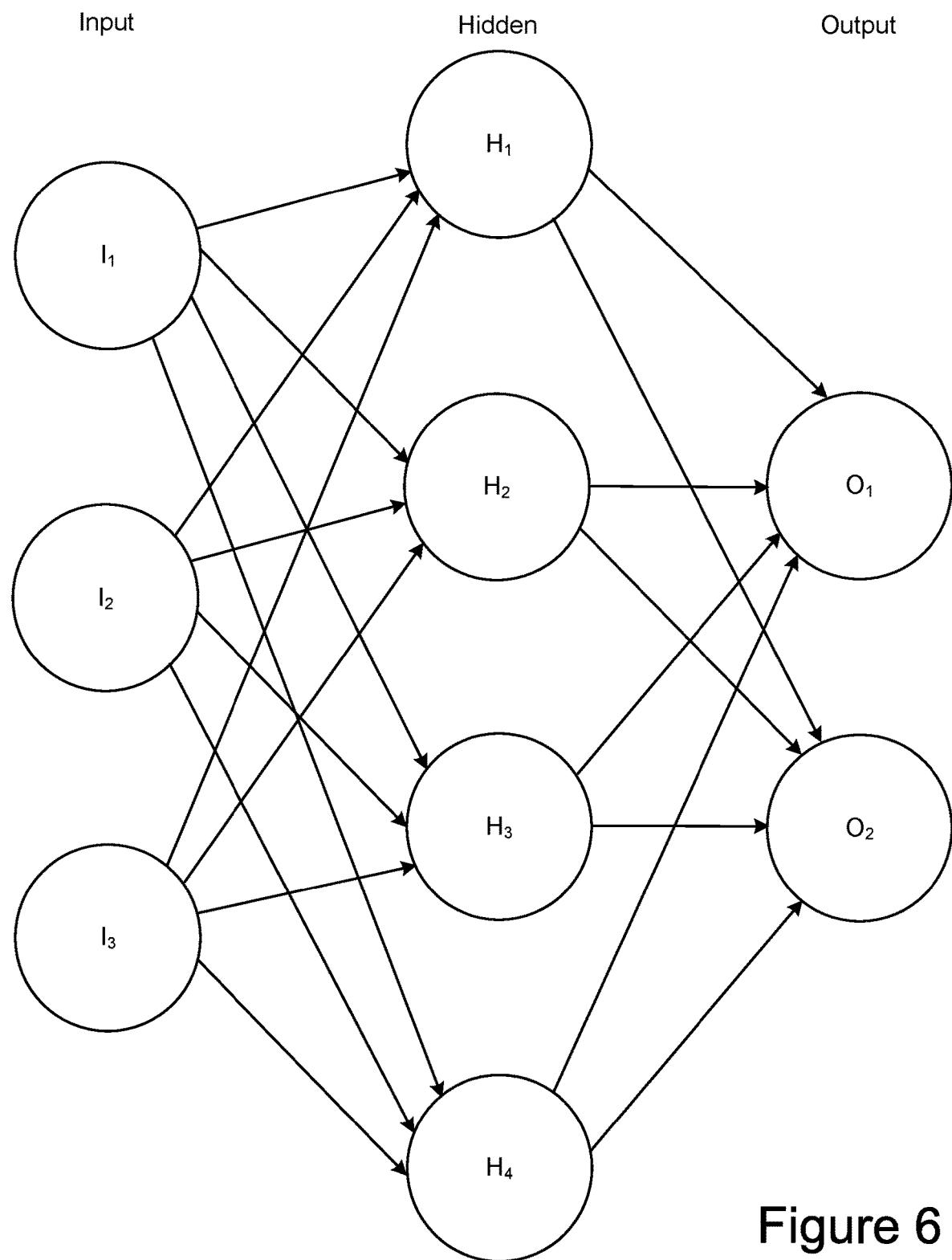
FIG. 6 illustrates a simple example of an artificial neural network.

Turning now to types of data that can be stored on non-volatile memory devices, a particular example of the type of data of interest in the following discussion is the weights used is in deep neural networks. An artificial neural network is formed of one or more intermediate layers between an input layer and an output layer. The neural network finds a mathematical manipulation to turn the input into the output, moving through the layers calculating, the probability of each output. FIG. 6 illustrates a simple example of an artificial neural network.

In FIG. 6 an artificial neural network is represented as an interconnected group of nodes or artificial neurons, represented by the circles, and a set of connections from the output of one artificial neuron to the input of another. The example shows three input nodes ($I_1$, $I_2$, $I_3$) and two output nodes ($O_1$, $O_2$), with an intermediate layer of four hidden or intermediate nodes ($H_1$, $H_2$, $H_3$, $H_4$). The nodes, or artificial neurons/synapses, of the artificial neural network are implemented by logic elements of a host or other processing system as a mathematical function that receives one or more inputs and sums them to produce an output. Usually each input is separately weighted and the sum is passed through the node's mathematical function to provide the node's output.

In common artificial neural network implementations, the signal at a connection between nodes (artificial neurons/synapses) is a real number, and the output of each artificial neuron is computed by some non-linear function of the sum of its inputs. Nodes and their connections typically have a weight that adjusts as a learning process proceeds. The weight increases or decreases the strength of the signal at a connection. Nodes may have a threshold such that the signal is only sent if the aggregate signal crosses that threshold. Typically, the nodes are aggregated into layers. Different layers may perform different kinds of transformations on their inputs. Signals travel from the first layer (the input layer), to the last layer (the output layer), possibly after traversing the layers multiple times. Although FIG. 6 shows only a single intermediate or hidden layer, a complex deep neural network (DNN) can have many such intermediate layers.

A supervised artificial neural network is "trained" by supplying inputs and then checking and correcting the outputs. For example, a neural network that is trained to recognize dog breeds will process a set of images and calculate the probability that the dog in an image is a certain breed. A user can review the results and select which probabilities the network should display (above a certain threshold, etc.) and return the proposed label. Each mathematical manipulation as such is considered a layer, and complex neural networks have many layers. Due to the depth provided by a large number of intermediate or hidden layers, neural networks can model complex non-linear relationships as they are trained.

Figure 7B:
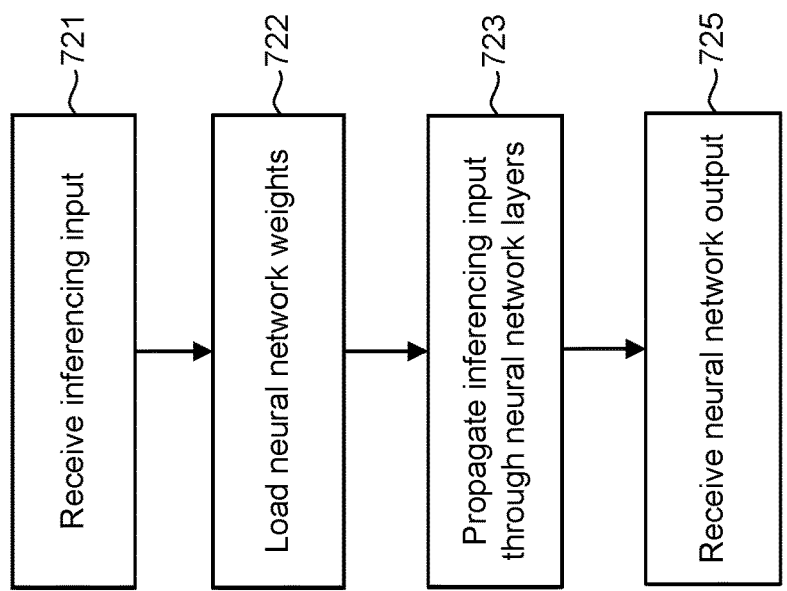
FIG. 7B is a flowchart describing one embodiment of a process for inference using a neural network.
Figure 7A:
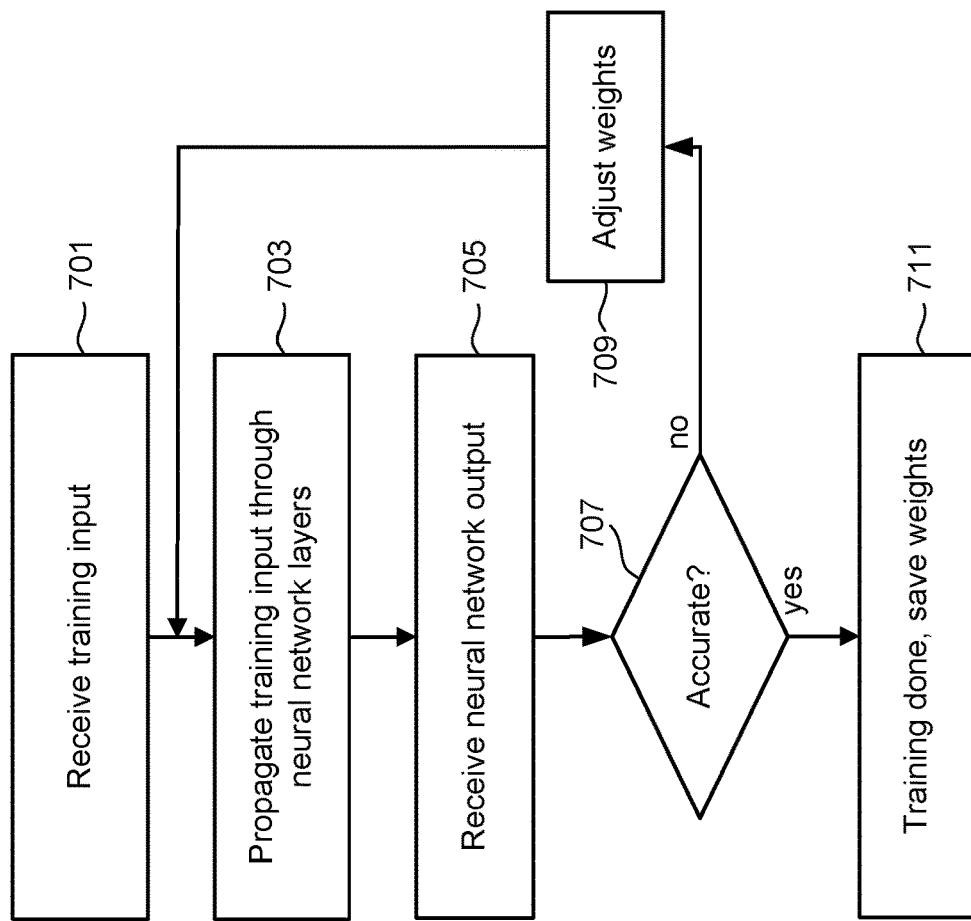
FIG. 7A is a flowchart describing one embodiment of a process for training a neural network to generate a set of weights.

FIG. 7A is a flowchart describing one embodiment of a process for training a neural network to generate a set of weights. The training process is often performed in the cloud, allowing additional or more powerful processing the accessed. At step 701, the input, such as a set of images, is received at the input nodes (e.g., $I_1$, $I_2$, $I_3$ in FIG. 6). At step 703 the input is propagated through the synapses connecting the input nodes to node of the next layer (e.g., $H_1$, $H_2$, $H_3$, $H_4$ in FIG. 6) using the current set of weights. The neural network's output is then received at next layer of nodes (e.g., $H_1$, $H_2$, $H_3$, $H_4$ in FIG. 6) in step 705, so that the values received as output from one layer serve as the input to the next layer. The inputs from the first layer are propagated in this way through all of the intermediate or hidden layers until they reach the output. In the dog breed example of the preceding paragraph, the input would be the image data of a number of dogs, and the intermediate layers use the current weight values to calculate the probability that the dog in an image is a certain breed, with the proposed dog breed label returned at step 705. A user can then review the results at step 707 to select which probabilities the neural network should return and decide whether the current set of weights supply a sufficiently accurate labelling and, if so, the training is complete (step 711). If the result is not sufficiently accurate, the neural network adjusts the weights at step 709 based on the probabilities the user selected, followed by looping back to step 703 to run the input data again with the adjusted weights. Once the neural network's set of weights have been determined, they can be used to "inference," which is the process of using the determined weights to generate an output result from data input into the neural network. Once the weights are determined at step 711, they can then be stored in non-volatile memory for later use, where the storage of these weights in non-volatile memory is discussed in further detail below.

FIG. 7B is a flowchart describing a process for the inference phase of supervised learning using a neural network to predict the "meaning" of the input data using an estimated accuracy. Depending on the case, the neural network may be inferenced both in the cloud and by an edge device's (e.g., smart phone, automobile process, hardware accelerator) processor. At step 721, the input is received, such as the image of a dog in the example used above. If the previously determined weights are not present in the device running the neural network application, they are loaded at step 722. For example, on a host processor executing the neural network, the weight could be read out of an SSD in which they are stored and loaded into RAM on the host device. At step 723, the input data is then propagated through the neural network's layers. Step 723 will be similar to step 703 of FIG. 7B, but now using the weights established at the end of the training process at step 711. After propagating the input through the intermediate layers, the output is then provided at step 725.

A subset of neural networks is a feedforward network in which data flows from the input layer, through the intermediate layers, and to the output layer without looping back. At first, in the training phase of supervised learning as illustrated by FIG. 7A, the neural network creates a map of virtual neurons and assigns random numerical values, or "weights", to connections between them. The weights and inputs are multiplied and return an output between 0 and 1. If the network does not accurately recognize a particular pattern, an algorithm adjusts the weights. That way the algorithm can make certain parameters more influential (by increasing the corresponding weight) or less influential (by decreasing the weight) and adjust the weights accordingly until it determines a set of weights that provide a sufficiently correct mathematical manipulation to fully process the data.

Figure 8:
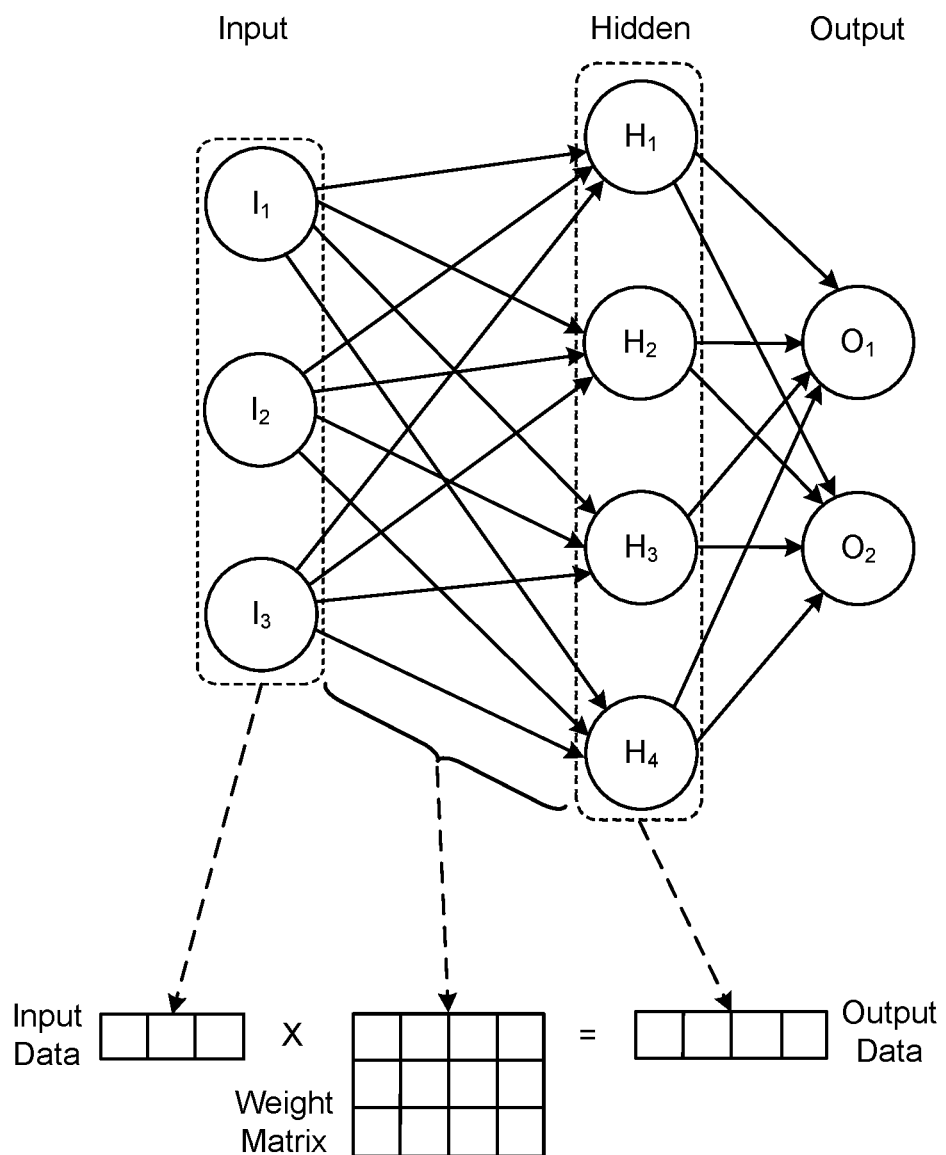
FIG. 8 is a schematic representation of the use of matrix multiplication in a neural network.

FIG. 8 is a schematic representation of the use of matrix multiplication in a neural network. Matrix multiplication, or MatMul, is a commonly used approach in both the training and inference phases for neural networks and is used in kernel methods for machine learning. FIG. 8 at top is similar to FIG. 6, where only a single hidden layer is shown between the input layer and the output layer. The input data is represented as a vector of a length corresponding to the number of input nodes. The weights are represented in a weight matrix, where the number of columns corresponds to the number of the number of intermediate nodes in the hidden layer and the number of rows corresponds to the number of input nodes. The output is determined by a matrix multiplication of the input vector and the weight matrix, where each element of the output vector is a dot product of the vector of the input data with a column of the weight matrix.

A common technique for executing the matrix multiplications is by use of a multiplier-accumulator (MAC, or MAC unit). However, this has a number of issues. Referring back to FIG. 7B, the inference phase loads the neural network weights at step 722 before the matrix multiplications are performed by the propagation at step 723. However, as the amount of data involved can be extremely large, use of a multiplier-accumulator for inferencing has several issues related to loading of weights. One of these is high energy dissipation due to having to use large MAC arrays with the required resolution. Another is high energy dissipation due to the limited size of MAC arrays, resulting in high amounts data movement between logic and memory and an energy dissipation that can be much higher than used in the logic computations themselves.

To help avoid these limitations, the use of a multiplier-accumulator array can be replaced with other memory technologies. For example, the matrix multiplication can be computed within a memory array by leveraging the characteristics of Storage Class Memory (SCM), such as those based on ReRAM, PCM, or MRAM based memory cells. This allows for the neural network inputs to be provided via read commands and the neural weights to be preloaded for inferencing. By use of in-memory computing, this can remove the need for logic to perform the matrix multiplication in the MAC array and the need to move data between the memory and the MAC array.

The following considers embodiments based on a non-volatile memory array structure where pairs of resistive memory cells, such ReRAM, MRAM, or PCM memory cells, are each connected to a common bit line, but to different word lines. The differential pairs of memory cells form unit synapse, each storing a neural network weight. By applying the input of a layer of a neural networks inputs as differential voltage inputs to a word line pair, multiplication of the input value with all of the weights stored in the corresponding unit synapses of the differential memory cell pairs connected along the word line pair can be determined concurrently within the array. By accumulating the results for the different word line pairs of the array, the matrix multiplication of an input vector and a weight matrix can be performed in-array. The following discussion primarily considers binary neural network embodiments, which are discussed first, but can also be extended to more general embodiments.

Figures 9, 10:
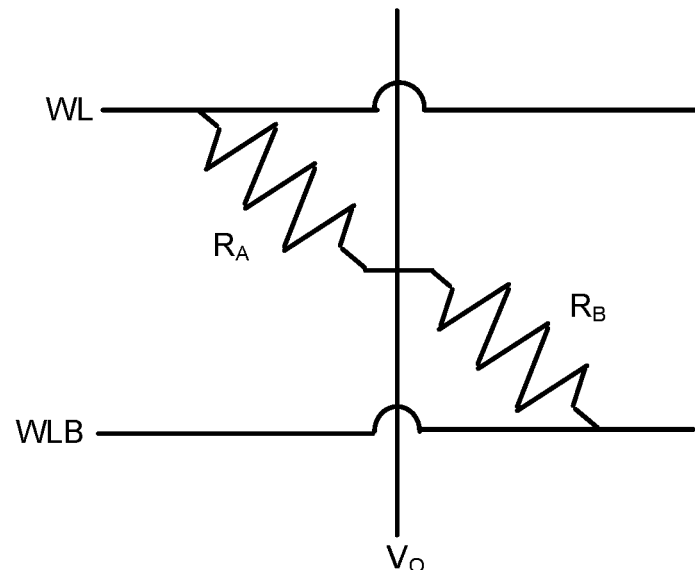
FIG. 9 is a table illustrating the output of a binary neural network in response to the different input-weight combinations.
FIG. 10 represents an embodiment where a two differential memory cells are used to form a unit synapse for storing a weight bit.

A technique that can be used to reduce the computational complexity of the inference process is by use of a Binarized Neural Network (BNN), in which a neural network works with binary weights and activations. A BNN (also called an XNOR-Net) computes the matrix-vector multiplication with "binary" inputs $\{-1, 1\}$ and "binary" weights $\{-1, 1\}$. FIG. 9 is a table illustrating the output of a binary neural network in response to the different input-weight combinations. As shown in the right-most column, when the input and weight match, the output is 1; and when the input and the weight differ, the output is −1.

When storing a binary weight in a binary memory cell format, if the −1 and +1 weight are respectively stored as unprogrammed and programmed memory cells, an unprogrammed weight (−1) will have a low output for either a low read level (such as ground) or a high read level. Because of this, only the +1 weight entries in the table of FIG. 9 will read correctly. To generate the correct response for the −1 weight levels requires that these be stored separately and in a complementary manner as the negative weights. In previous approaches to store binary weights, the weights and negative weights have been stored in either separate arrays or along different bit lines of an array. This requires two separate read operations, one for −1 weights and one for +1 weights, where the two read results are combined to determine the full result corresponding to the table of FIG. 9. To improve upon this situation, FIGS. 10-14 illustrate an embodiment for the realization of a neural network with binary-inputs and binary-weights in a non-volatile memory array storing weights in a differential memory cell structure using a pair of memory cells to store the weight, allowing the either weight value to be read in a single read operation.

FIG. 10 represents an embodiment where a two differential memory cells are used to form a unit synapse for storing a weight bit W. In the shown embodiment, the two memory cells, $R_A$ and $R_B$, of the unit synapse are resistive memory cells, such as ReRAM, MRAM, or PCM based memory cells, with complementary resistance levels are each connected between a corresponding word line WL, WLB and a shared bit line. The input, or neuron value, IN is applied to the word line pair, or differential word line, of WL, WLB. The output O is then the product of the input IN and the weight W corresponding to the level on the bit line BL.

FIG. 11 illustrates the encoding of the input values, weight values, and output values as word line voltages, resistance values, and bit line voltages, respectively. For the input values IN, a +1 input corresponds to a high voltage level V (a few volts or a few tenths of a volt, for example) applied to WL and a low voltage level (such as ground, or 0) applied to WLB. An input of IN=−1 corresponds to a low voltage level 0 applied to WL and a high voltage level V applied to WLB. Consequently, as shown in the first three columns of FIG. 11, a +1 neuron is presented as (V, 0) on (WL, WLB) and −1 neuron as (0,V).

For the weight values W, a +1 weight corresponds to a low resistance state (LRS) for $R_A$ and a high resistance state (HRS) for $R_B$. A weight values of W=+1 weight corresponds to a high resistance state (HRS) for $R_A$ and a low resistance state (LRS) for $R_B$, as represented in the $4^{th}$, $5^{th}$ and $6^{th}$ columns of FIG. 11. When an input voltage pattern is applied to the word line pair (WL, WLB), the unit synapse acts as a voltage divider, whose output is the voltage $V_O$ on the bit line BL with an output value of O=IN*W, as can be illustrated with respect to FIGS. 12A-12D.

FIGS. 12A-12D respectively correspond to the four cases illustrated in the four lines FIG. 11. In FIG. 12A, an input of IN=−1, corresponding to (WL, WLB)=(0, V), is applied to a weight of W=+1, corresponding to $(R_A, R_B)$=(LRS, HRS). The resultant voltage on the bit line is then:

$$V_O = V_{BL} = V(R_L/(R_L+R_H)) = V_L,$$

where $V_L$ corresponds to an output of O=−1. In FIG. 12B, an input of IN=+1, corresponding to (WL, WLB)=(V, 0), is applied to a weight of W=+1, with the resultant voltage on the bit line of:

$$V_O = V_{BL} = V(R_H/(R_L+R_H)) = V_H,$$

where $V_H$ corresponds to an output of O=+1. FIGS. 12C and 12D similarly represent the respective IN=−1 and IN=+1 for the W=−1 cases, with respective outputs on the bit line BL of $V_O = V_H$ (O=+1) and $V_O = V_L$ (O=−1).

As illustrated by FIGS. 12A-12D, the differential pair of memory cells with complementary resistive values of a unit synapse form a voltage divider such that the bit line BL voltage corresponds to the output values (+1, −1). The differential representation of word line voltage patterns and resistance states perfectly match the truth table of FIG. 11 to generate O=IN*W in a single in-array sensing operation.

The resistive memory cells of the unit synapse can be implemented in a number of different forms, some of which are illustrated in FIGS. 13A-13C. FIG. 13A illustrates 1 transistor, 1 resistor (1T1R) embodiment for a resistive memory cell, in which a resistor and transistor are connected in series. The resistor portion in FIG. 13A (and FIGS. 13B and 13C) can be implemented using ReRAM, MRAM, PCM, or other material with a programmable resistance. When the transistor is off, the memory cell will not conduct; and when the transistor is on, the resistance level of the memory cell is based on the resistance level programmed into the programmable resistance material. FIG. 13B illustrates an embodiment where the memory cell includes 1 switch in series with 1 resistor (1S1R), where, for example, the resistor can be implemented as a phase change material and the switch is an ovonic threshold switch (OTS). FIG. 13C illustrates an embodiment where the cell is a single resistor (1R) embodiment.

The inclusion of a transistor or switch in parallel with the resistance, as in the 1T1R and 1S1R embodiments, allowing the memory cell to cut off can be useful in situations, such as facilitating the programming of a memory array. Although the structures presented here can be used in training phase of operating a neural network, involving the programming of the memory cells, the focus in the following will be on inferencing, where the weights have been previously written into memory array, and be based on the 1R embodiments for the memory cells of the unit synapses.

Figure 14:
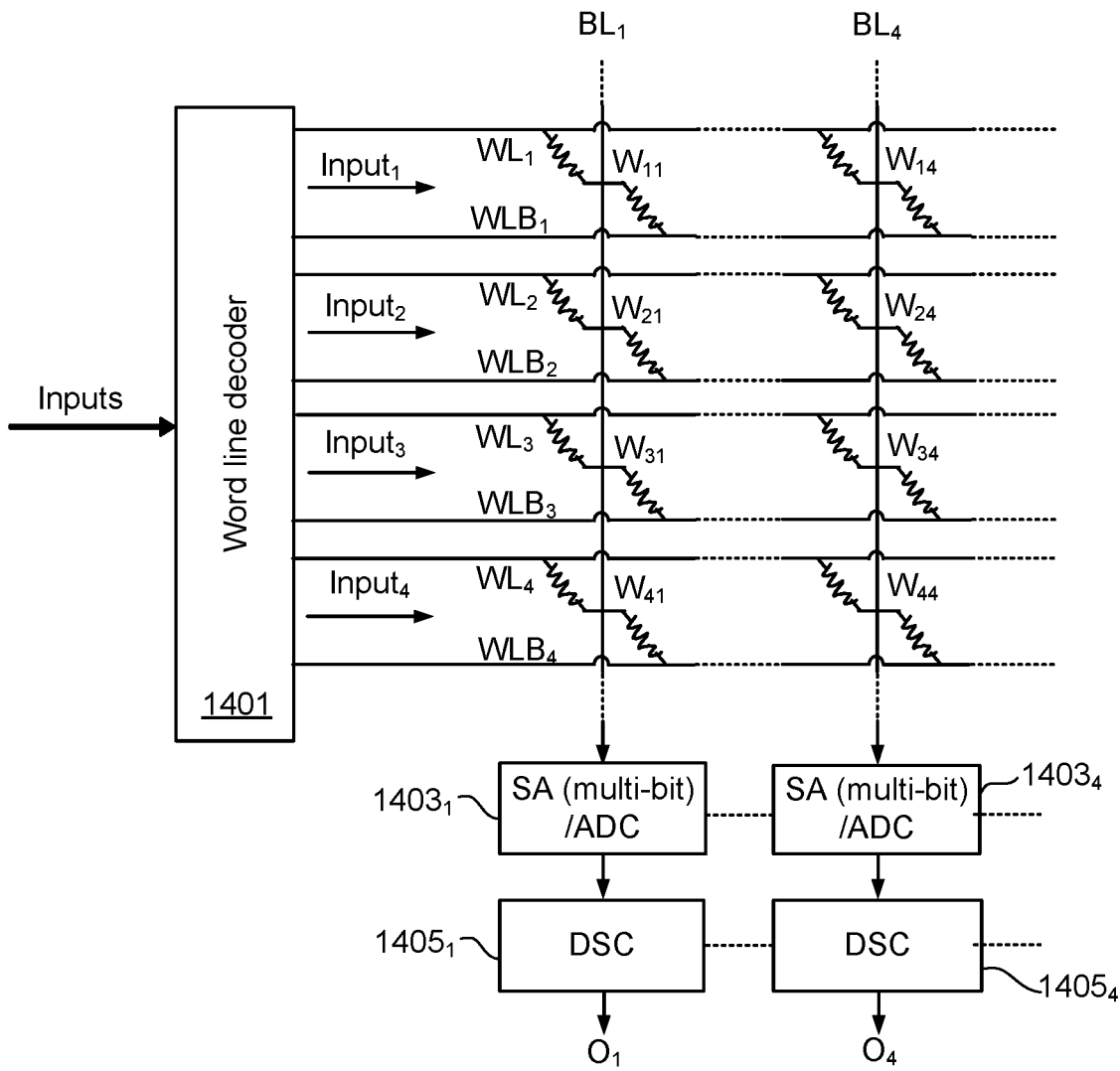
FIG. 14 illustrates the incorporation of the unit synapses of FIG. 10 into an array.

FIG. 14 illustrates the incorporation of the unit synapses of FIG. 10 into an array, such as in the memory structure 326 of FIG. 5. FIG. 14 shows a small portion (four word line pairs and two bit lines) of what can be a much larger. More specifically, illustrates four word line pairs ($WL_1,WLB_1$; $WL_2,WLB_2$; $WL_3,WLB_3$; $WL_4,WLB_4$) extending across N bit lines, of which only $BL_1$ and $BL_4$ are shown, and where the number of word line pairs can extend to a much larger number of such pairs spanning the bit lines of the array. Although the word lines of a (WL, WLB) pair are shown as adjacent in the embodiment of FIG. 14, this need not be the case for other embodiments. The array can be laid out in a two dimensional structure are represented in FIG. 14, or use a three dimensional architecture, some examples of which are discussed below with respect to FIGS. 20 and 21. Depending on the embodiment, a single memory integrated circuit may have one or multiple such arrays formed upon it.

At the intersection of each word line pair ($WL_i, WBL_i$) with a bit line $BL_j$ is a unit synapse storing a weight $W_{i,j}$, where one resistive memory cell of the unit synapse is connected between $WL_i$ and $BL_j$ and the other resistive memory cell of the unit synapse is connected between $WLB_i$ and $BL_j$ to provide the differential memory cell structure. When storing a binary weight, one of the resistors will be programmed at a high resistance state and the other in a low resistance state. A word line decoder 1401 applies the differential voltage pattern to the word line pairs based on the received inputs, which are translated into either the +1 pattern of (V, 0) or the −1 pattern of (0, V). As the word line pairs span the bit lines of the array, the input applied to (WL$_1$,WLB$_1$), for example, will be concurrently applied to all of the weights W$_{i,j}$ along this word line pair. This allows for the concurrent multiplication of the input Input$_1$ with all of the weights W$_{1,j}$ along the word line pair (WL$_1$,WLB$_1$), where the output for each multiplication correspond to the voltage level on the corresponding bit line BL$_j$.

The output level on each bit line BL$_j$ can be determined by a sense amplifier SA/ADC 1403$_j$. For the case when one single binary input is being applied to binary weights (as have been discussed so far) the sense amplifiers SA/ADC 1403$_j$ only need to distinguish between a V$_H$ state, corresponding to a +1 output, and a V$_L$ state, corresponding to a −1 output. For embodiments (as described below) where multiple inputs are applied concurrently, multi-bit weights are used, or both, the sense amplifiers 1403$_j$ can be multi-bit sense amplifiers or ADC capable of distinguishing a multi-bit output. For the multi-bit sensing, the distinct levels can be sensed concurrently or sequentially, depending on the embodiment, as is discussed below with respect to FIGS. 16 and 19.

Figure 15:
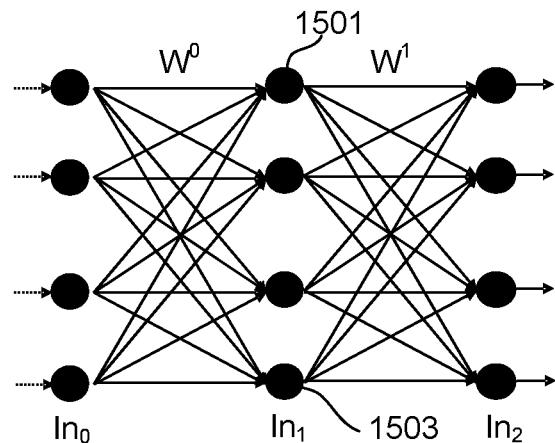
FIG. 15 relates the matrix multiplication for a neural network more closely to the structure of FIG. 14.

The application of the inputs to the array of weights effects the in-array multiplication operations, the results of which are determined by the sense amplifiers SA/ADC 1403$_j$ along the bit lines BL$_j$. To perform the accumulation phase of a multiplication and accumulation operation, each of the sense amps 1403$_j$ can be connected to a corresponding digital summation circuit DSC$_j$ 1405$_j$ to provide the accumulated output O$_j$, corresponding to the matrix multiplication described above with respect to FIG. 8. The digital summation circuit can be implemented on the memory circuit or, in other embodiments, outside the memory circuit (such as on the controller 102, FIG. 1) so that the summation circuit can accumulate the sum form different memory arrays. FIG. 15 relates the matrix multiplication for a neural network more closely to the structure of FIG. 14.

FIG. 15 illustrates an example of a neural network and its implementation through an array of differential memory cells. In the process described above with respect to FIG. 14, the response to an input of one unit synapse along each bit line is determined based on the voltage level on the bit line. The contribution of each of the synapses along a bit line can be determined sequentially by the sense amplifiers for the different inputs and accumulated. In some embodiments, multiple input can be applied concurrently.

Figure 25:
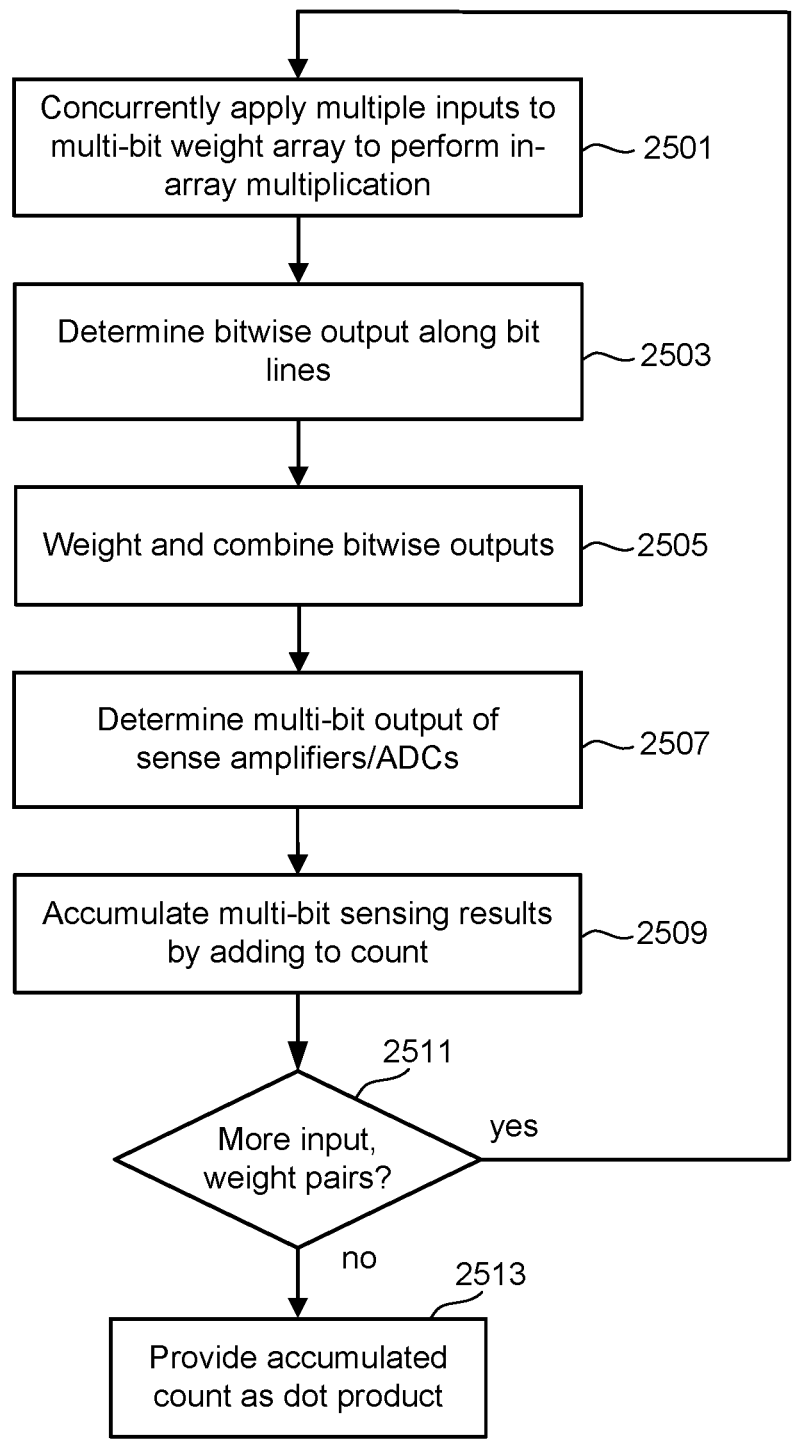
FIG. 25 is a flowchart for one embodiment of a dot-product calculation similar to FIG. 24, but that incorporates the parallelism of applying multiple inputs to the multi-bit weights concurrently.

The example of FIG. 15 shows three fully connected layers of four nodes (corresponding to neurons of the layer) each, so that the weight matrix between the layer is a 4×4 matrix. In FIG. 25, the inputs from the nodes are labelled as IN$_{l,i}$, where l is the layer index and i is the neuron index. In the example of FIG. 15, three layers are shown, l=(0,1,2), and each has four nodes, i=(1,2,3,4). The weight matrices W$_{l,i,j}$, whose entries correspond to the synapses, connecting the layers are then 4×4 matrices where the matrix multiplication to form the dot-products from the inputs of one layer to the next is:

$$IN_{l+1,j}=O_{l,j}=\Sigma_i IN_{l,i}*W_{l,i,j},\qquad(eq.\ 1)$$

where the sum runs over the index i. The inputs of one layer are applied as voltage patterns on the word line pairs to the unit synapses to generate dot product values, which are in turn the inputs of the next layer.

As discussed above, FIG. 14 is a schematic representation of how these weight matrices are stored in the unit synapses of the array for the in-array computations of matrix multiplication. The weight matrix between a pair of layers is stored in a number of unit synapses along a number of bit lines, where the number of unit synapses per bit line and the number of bit lines corresponds to the size of the weight matrix. In the example of FIG. 14, a 4×4 weight matrix would corresponds to 4 unit synapses along each of 4 bit lines. As represented in FIG. 14 these can 4 adjacent unit synapses on bit lines BL$_1$-BL$_4$ (where only BL$_1$ and BL$_4$ are shown), but these can be distributed across the array differently depending on the embodiment.

Relative to the representation of FIG. 15, a weight matrix is stored on the array in a transposed form. For example, the weights from the different inputs of first layer of FIG. 15 into the top node 1501 of the second layer are stored along the first bit line BL$_1$; and the weights into the bottom node 1503 are stored along the fourth bit line BL$_4$.

To compute the different dot-products of the matrix multiplication (the sum over i in equation 1 above), the data inputs can be provided in a sequence of read commands. To compute the output of single layer, the pages of weights are then read sequentially by the sense amplifiers over, in this example, four cycles:

cycle 1: achieve IN$_{0,1}$*W$_{0,1,1}$;
cycle 2: achieve IN$_{0,2}$*W$_{0,1,2}$;
cycle 3: achieve IN$_{0,3}$*W$_{0,1,3}$; and
cycle 4: achieve IN$_{0,4}$*W$_{0,1,4}$, where each of the cycles corresponds to a loop in the flow of FIG. 16 below and different sensing orders can be used in different embodiments. The results of the cycles are sensed by the sense amplifier SA/ADC 1403$_j$ on each bit line BL$_j$ and accumulated in the DSC 1405$_j$. The output O$_{l,j}$ from each bit line will then be the inputs of the next layer of the network.

Figure 16:
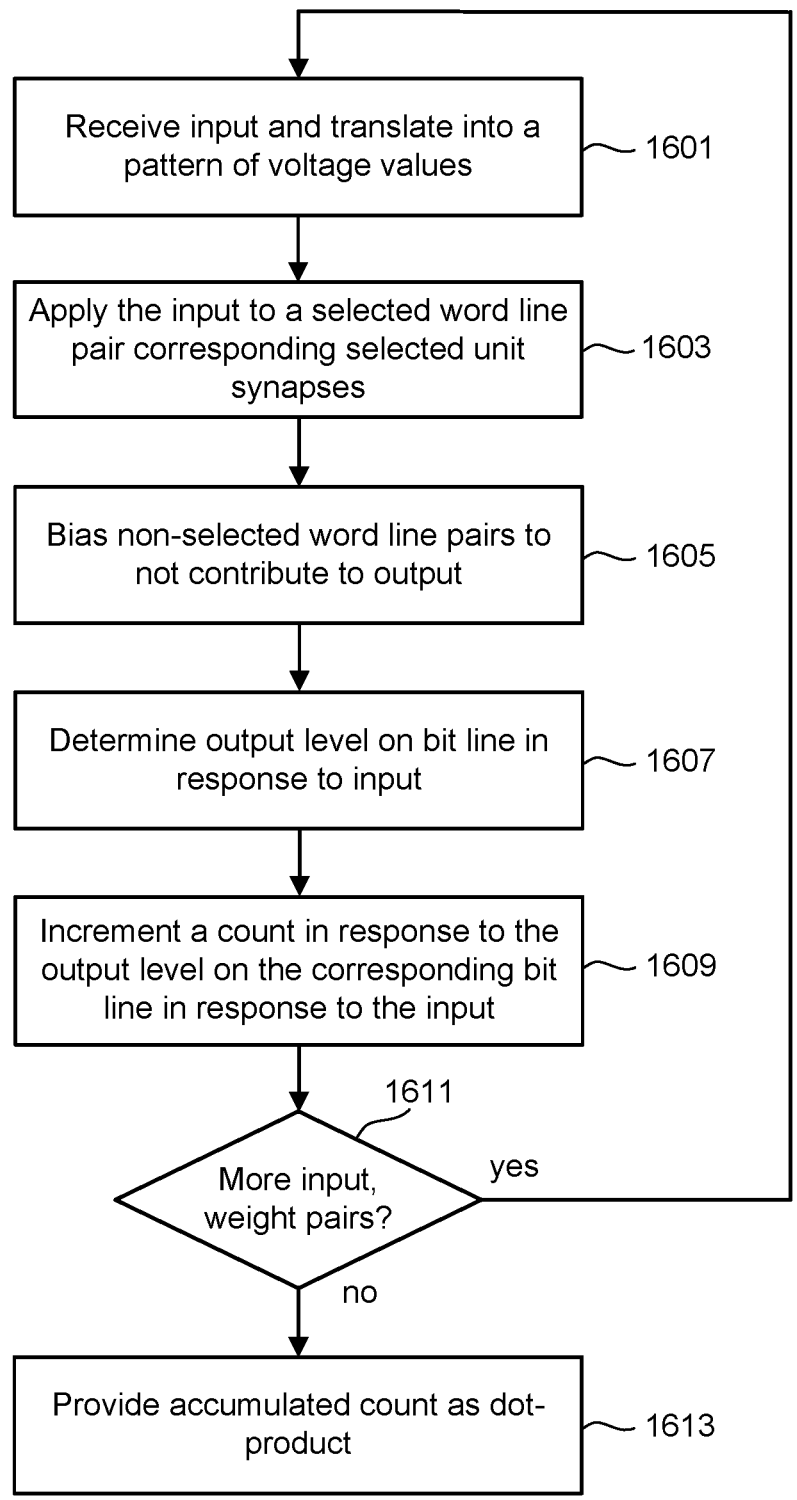
FIG. 16 is a flowchart for one embodiment of a matrix multiplication calculation using a binary neural network in inference as illustrated for the array architecture of FIG. 14.

FIG. 16 is a flowchart for one embodiment of a matrix multiplication, or dot-product, calculation using a binary neural network in inference, as described schematically for the neural network layers of FIG. 15 and array architecture of FIG. 14. Beginning at step 1601, and referring to FIG. 14, the memory array receives an input Input$_i$ at the word line decoder 1401 and translates this into the pattern of voltage values corresponding to a −1 or +1 input value as represented in the table of FIG. 11. Step 1603 applies the voltage levels to the selected word line pair (WL$_i$, WLB$_i$) corresponding to the unit synapses of the selected weights. As the word lines span the bit lines of the array, the process of FIG. 16 can be performed concurrently for any of the unit synapses connected along the word line pair (WL, WLB). Additionally, in the array structure, the unit synapses on non-selected word line pairs along the bit lines of the array are biased to not contribute to the output, such as floating both word lines of non-selected word line pairs, at step 1605. Although listed as an ordered set of separate steps in FIG. 16, steps 1603 and 1605 are typically performed concurrently by the word line decoder 1401.

Step 1607 determines the response of memory cells of the selected unit synapse. As illustrated in the table of FIG. 11, the voltage level on the unit synapses' bit line corresponds to the output logic value of the unit synapse in response to the input and can be determined by the sense amplifier SA/ADC 1403$_j$ on the corresponding bit line BL$_j$. Based on the state of the unit synapse, at step 1609 the value of count of the corresponding DSC 1405$_j$ is either incremented or decremented based on the output O$_j$ as discussed above with respect the table of FIG. 11.

Step 1611 determines if there are more input, weight pairs to add to the matrix multiplication, or dot-product, and, if so, the flow loops back to step 1601. Once the contributions of all of the input, weight pairs to the dot products have been determined, the dot product can be provided at step 1613.

The set of dot-products determined at step 1613 can then serve as the input to a subsequent neural network layer or be the output from the last layer of the inference process.

The flow of FIG. 16 applied one input at a time to the weight array, summing the outputs of the individual inputs to complete the matrix multiplication. For embodiments of FIG. 14 where multi-bit sense amplifiers for SA/ADC 1403$_j$ are available, multiple inputs can be applied concurrently to the word line pairs. The voltage level on a bit line will then reflect the summed outputs from the input-weight products, increasing the level of parallelism and consequent performance. The number of inputs that be successfully applied concurrently will depend on the level of resolution of the analog-to-digital conversion that a SA/ADC 1403$_j$ can provide, where if sufficient resolution is available a whole column of all of the unit synapses along a bit line can be computed in one operation. The multiple input sensing operation can be illustrated with reference to FIG. 17.

Figure 17:
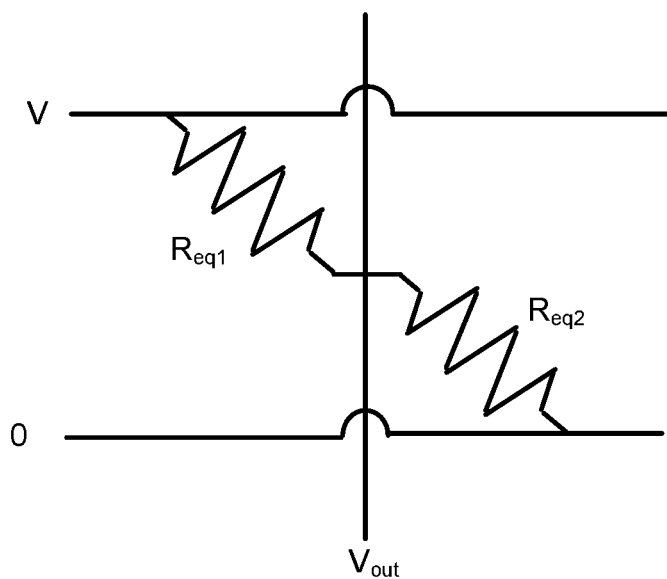
FIG. 17 illustrates an equivalent voltage divider for a concurrent multi-input in-array matrix multiplication operation.

FIG. 17 illustrates an equivalent voltage divider for a concurrent multi-input in-array matrix multiplication operation. A first equivalent resistance $R_{eq1}$ is connected between the high input voltage level V and the shared bit line, and a second equivalent resistance $R_{eq2}$ is connected between the low input voltage level 0 and the shared bit line. The $V_{out}$ level on the bit line will be:

$$V_{out} = V \cdot \frac{R_{eq1}}{R_{eq1} + R_{eq2}}.$$

If N is the number of inputs, such as the whole length or some sub-set of a bit line, let A be the number of +1 outputs and B is the number of −1 outputs, then N=A+B and:

$$R_{eq1} = \frac{1}{A \cdot \frac{1}{R_H} + B \cdot \frac{1}{R_L}},$$

$$R_{eq2} = \frac{1}{A \cdot \frac{1}{R_L} + B \cdot \frac{1}{R_H}}.$$

Using these expressions for $R_{eq1}$ and $R_{eq2}$ gives:

$$V_{out} = V \cdot \frac{\frac{1}{A \cdot \frac{1}{R_H} + B \cdot \frac{1}{R_L}}}{\frac{1}{A \cdot \frac{1}{R_L} + B \cdot \frac{1}{R_H}} + \frac{1}{A \cdot \frac{1}{R_H} + B \cdot \frac{1}{R_L}}}$$

$$= V \cdot \frac{A \cdot (R_H - R_L) + N \cdot R_L}{N \cdot (R_H + R_L)}.$$

Figure 18:
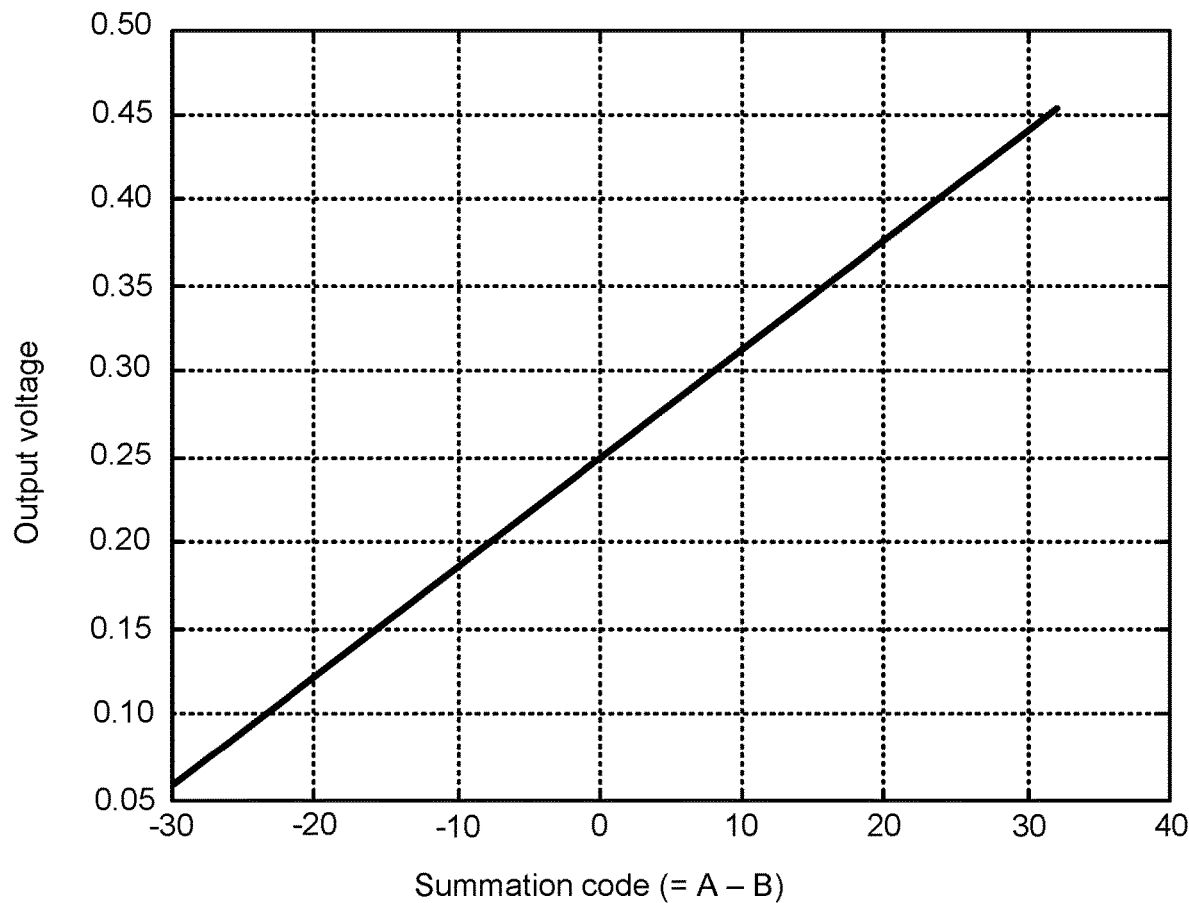
FIG. 18 illustrates the relation between the output voltage as seen on the bit line and the summation code determined in a concurrent sensing of multiple input, weight products.

The equation demonstrates that a string of weight bits follows the voltage divider rule and the output voltage $V_{out}$ corresponds to the output summation code (A-B) linearly, as illustrated in FIG. 18. The range of the $V_{out}$ level is only weakly dependent on the absolute value of the $R_H$ and $R_L$ values. To take one embodiment, the values of V=0.5V, $R_L$=10K, and $R_H$=100K can be used, and a 3-bit ADC for the multi-state sense amplifiers allows a 50 mV step size.

FIG. 18 illustrates the relation between the output voltage $V_{out}$ as seen on the bit line and the summation code (A-B), corresponding the number of +1 outputs minus the number of −1 outputs determined in a concurrent sensing of multiple input, weight products. As seen in FIG. 18, the output voltage rises linearly with the difference (A-B) so that a multi-bit sense amplifier can translate the output voltage to the corresponding matrix multiplication value.

Figure 19:
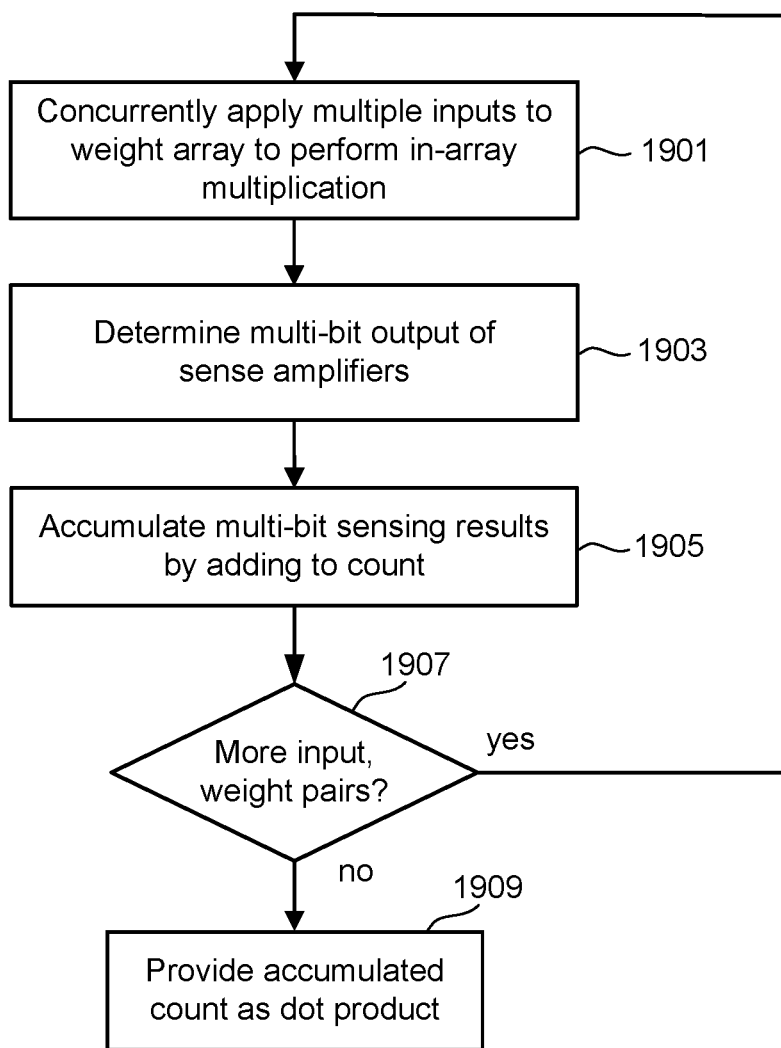
FIG. 19 is a flowchart for one embodiment of a dot-product calculation similarly to FIG. 16, but that incorporates the parallelism of applying multiple inputs concurrently.

FIG. 19 is a flowchart for one embodiment of a dot-product calculation performed similarly to that of FIG. 16, but that incorporates the parallelism of applying multiple inputs concurrently. Relative to step 1601, the parallel sensing of weights on each bit line at step 1901 can now apply multiple inputs concurrently in each loop. At step 1903, the output of the sense amplifier is now a multi-bit value, rather than the binary value of step 1603, and corresponds to the number of unit synapses contributing high outputs minus those contributing low outputs along a bit line. The multi-bit value is then accumulated at step 1905. The flow then determines whether there are more inputs at step 1907 and, if so, loops back to step 1901. Once all of the input, weight combinations have been determined, the flow then goes from step 1907 to 1909, providing the accumulated count as the result of the matrix multiplication.

The read process for a unit synapse formed of a differential pair of memory cells (whether only a single word line pair is selected at a time as in FIG. 16 or multiple word line pairs are concurrently selected as in FIG. 19) differs from a standard read operation. In a standard read operation, where the object is to determine the data state stored in a memory cell, the determination is made by a sense amplifier based on a current or voltage level along on a bit line based on the state of a single selected memory cell. When multiple cells along a common bit line are sensed at the same time, it is not possible to determine the resistance level of the individual memory cells and establish their corresponding data states. For the summation circuit's output from the matrix multiplication, however, it is only the sum of the cumulative sum of outputs from the unit synapses that is wanted, not which of the individual synapses contribute. Consequently, the response of multiple unit synapses on word line pairs in response to a corresponding set of inputs can be determined concurrently, thereby increasing parallelism, if the sense amplifier is able to determine the number of conducting synapses. By incorporating multi-sense amplifiers, the embodiment of FIG. 14 lets multiple unit synapses along a common bit line to be sensed in parallel.

In addition to applying multiple inputs concurrently to an array of weights, parallelism can be further increased by operating multiple arrays in parallel. The multiple arrays can be formed on the same memory chip or spread across multiple memory chips. Depending on the embodiment, the weights corresponding to different layers of a neural network can be stored in the same array or in different arrays, where using different arrays for different layers can allow pipelining, where the outputs of one layer/array can serve as the inputs of the next layer/array.

Referring back to FIG. 14, this represented the differential memory array for storing the weights in a two dimensional structure. The same differential topology can also use a three dimensional structure, such as a differential cross-point (DX) memristor array as represented in FIG. 20 or as an extended three dimensional architecture as represented in FIG. 21.

Figure 20:
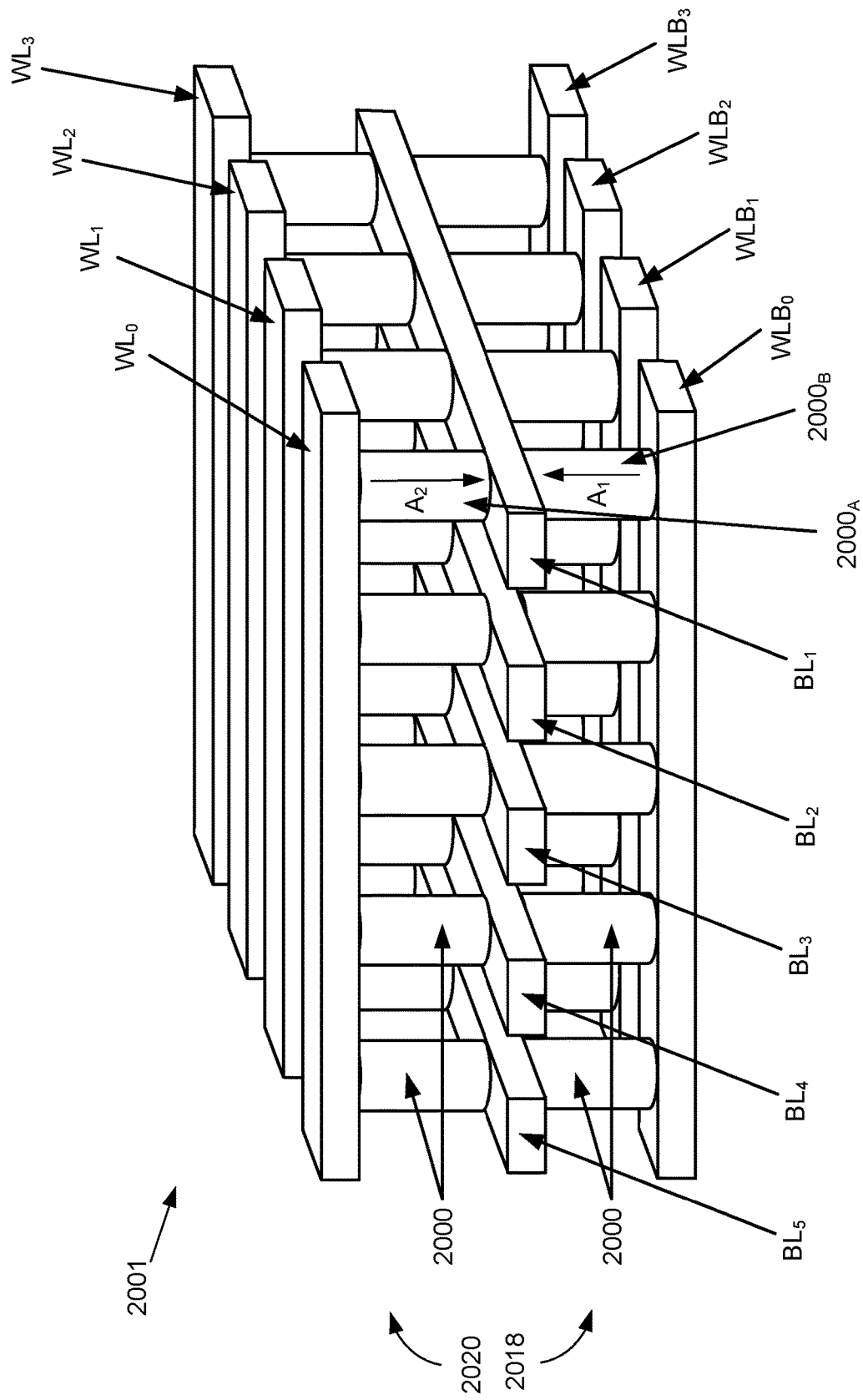
FIG. 20 depicts one embodiment of a portion of a monolithic three-dimensional memory array that forms a differential cross-point (DX) architecture.
Figure 21:
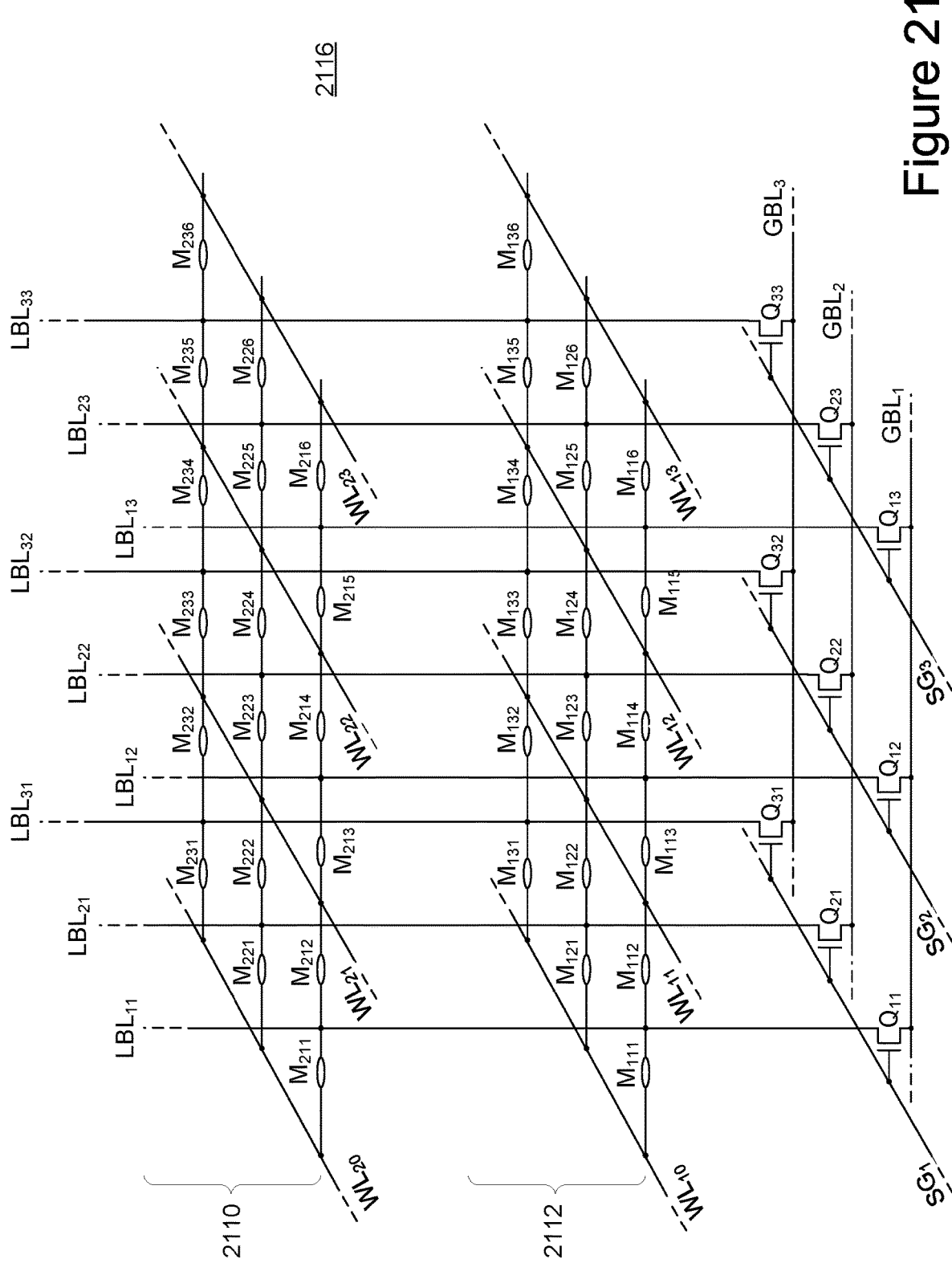
FIG. 21 provides an embodiment using an extended three dimensional structure for the storage of neural network weights.

FIG. 20 depicts one embodiment of a portion of a monolithic three-dimensional memory array 2001 that forms a differential cross-point (DX) architecture that includes a second memory level 2020 positioned above a first memory level 2018. Memory array 2001 is one example of an implementation for memory array 326 in FIG. 5. The bit lines $BL_1$-$BL_5$ are arranged in a first direction (represented as running into the page) and the word lines $WL_1$-$WL_4$ and $WLB_1$-$WLB_4$ are arranged in a second direction perpendicular to the first direction. FIG. 20 is an example of a horizontal cross-point structure in which word lines $WL_1$-$WL_4$ and $WLB_1$-$WLB_4$ and $BL_1$-$BL_5$ both run in a horizontal direction relative to the substrate, while the memory cells 2000 are oriented so that the current runs in the vertical direction. As depicted, the upper conductors of first memory level 2018 may be used as the lower conductors of the second memory level 2020 that is positioned above the first memory level. In a memory array with additional layers of memory cells, there would be corresponding additional layers of bit lines and word lines.

As depicted in FIG. 20, memory array 2001 includes a plurality of memory cells 2000. The memory cells 2000 may include re-writeable memory cells, such as can be implemented using ReRAM, MRAM, PCM, or other material with a programmable resistance. With respect to first memory level 2018, a first portion of memory cells 2000 are between and connect to bit lines $BL_1$-$BL_5$ and word lines $WL_1$-$WL_4$. With respect to second memory level 2020, a second portion of memory cells 2000 are between and connect to bit lines $BL_1$-$BL_5$ and word lines $WLB_1$-$WLB_4$. As discussed with respect to FIGS. 13A-13C, in one embodiment, each memory cell includes a select switch or steering element (e.g., an ovonic threshold switch or a diode) and a memory element (i.e., a phase change memory element). In one example, the current in the memory cells of the first memory level 2018 may flow upward as indicated by arrow $A_1$, while the current flowing in memory cells of the second memory level 2020 may flow downward as indicated by arrow $A_2$, or vice versa. In another embodiment, each memory cell includes a state change element and does not include a select switch element. The absence of a select switch (or other steering element) from a memory cell may reduce the process complexity and costs associated with manufacturing a memory array.

In the cross-point structure of FIG. 20, a differential memory cell of a unit synapse can be formed by one memory cell from layer 2020, connected between one of the word lines $WL_1$-$WL_4$ and one of the bit lines $BL_1$-$BL_5$, and one memory cell from layer 2018, connected between $WLB_1$-$WLB_4$ and the same one of bit lines $BL_1$-$BL_5$. For example, a unit synapse can be formed by the combination of memory cell 2000A, connected between $WL_1$ and $BL_1$ and having a resistance level $R_A$, and memory cell 2000B, connected between $WLB_1$ and $BL_1$ and having a resistance level $R_B$, can form a unit synapse as represented in FIG. 10. Although this example is formed of directly opposing memory cells in the cross-point structure, more generally other memory cells pairs along a shared bit line can be used.

FIG. 21 depicts one embodiment of a portion of a monolithic three-dimensional memory array 2116 that includes a first memory level 2112 positioned below a second memory level 2110. The architecture of FIG. 21 provides another example of an embodiment that can be used for the storage of neural network weights, in this case using an extended three dimensional structure. Memory array 2116 is one example of an implementation for memory array 326 in FIG. 5. As depicted, the local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). This structure can be used with a number of different memory cell structures. In one example, the particular memory cell may include a floating gate device or a charge trap device (e.g., using a silicon nitride material). In another example, the particular memory cell may include a reversible resistance-switching material, a metal oxide, a phase change memory material, a ReRAM material, an MRAM material, or a PCM material. The global bit lines $GBL_1$-$GBL_3$ are arranged in a third direction that is perpendicular to both the first direction and the second direction. A set of bit line select devices (e.g., $Q_{11}$-$Q_{31}$), such as a vertical thin film transistor (VTFT), may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

In the embodiment of FIG. 21, a unit synapse can be formed of a differential pair of memory cells connected between a shared bit line and one of each a corresponding pair of word lines. For example, a unit synapse can be formed of the differentia pair of memory cells (as upper left) $M_{211}$, connected between $WL_{20}$ and $LBL_{11}$, and $M_{212}$ connected between $WL_{21}$ and $LBL_{11}$.

The discussion so far has considered binary neural networks, where both of the input and the weights are binary values, but the use of the differential memory cell structure can be applied more generally. For example, multiple differential memory cells can be used to store multi-bit weight values. In other embodiments, the technique can be expanded by using multi-level cells, multi-level input voltages, or both.

In a multi-level cell embodiment, each of the memory cells of the unit synapse of FIG. 10 can store data in a multi-level format and have more than two values for the resistance levels $R_A$ and $R_B$. In a differential 2-bit multi-level cell embodiment, for example, $R_A$ can be one of the values $\{-1, -0.5, 0.5, 1\}$ and $R_B$ the complementary value of $\{1, 0.5, -0.5, -1\}$. Other embodiments can store more bits per unit synapse of differential memory cell pair or even store data as a continuous range of resistance levels. Use of a multi-level cell embodiment can achieve a neural network with a higher accuracy, but at the cost of more complexity with the read margin is constrained by the read voltage and the ADC resolution.

Figure 22:
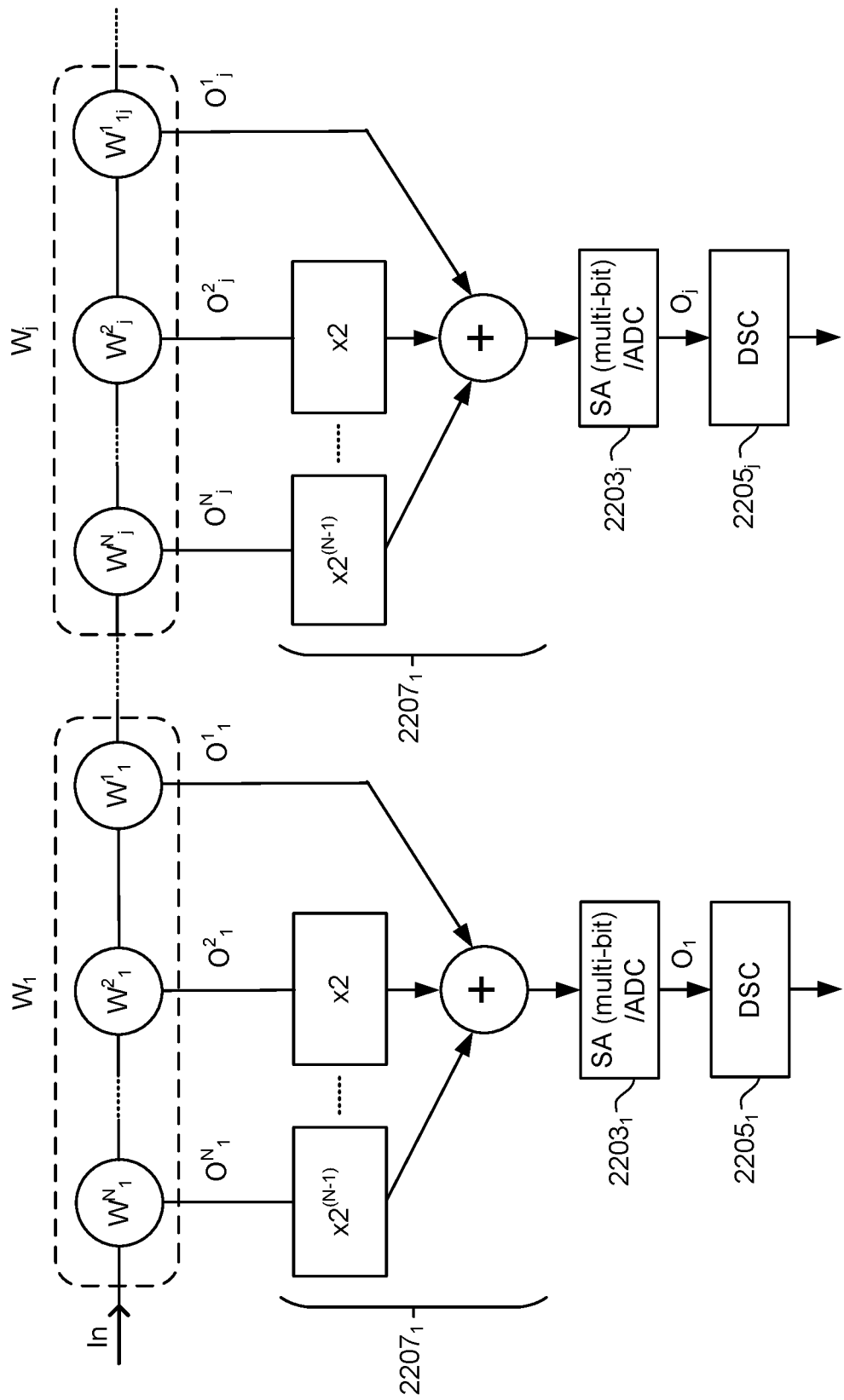
FIG. 22 is a schematic representation of storing a multi-bit weight in a non-volatile memory array for use in an in-array inferencing operation.

The use of multiple differential memory cells to store multi-bit weight values is described in more detail with respect to FIGS. 22-27. In one set of embodiments, to store an N-bit weight value N copies of the differential memory cell structure of FIG. 10 connected along the same word line pair are used, each storing one bit of a multi-bit weight value and each connected to a different bit line. When a differential input is applied to the word line pair, the output on the bit line from each of the differential memory cells will give the corresponding bit from the matrix multiplication. The different outputs can then be weighted according to the significance of the bit they represent and combined. As with the binary case described above, the results from multiple inputs can be accumulated to perform a matrix multiplication operation. Although the following discussion is primarily presented in the context of a differential memory cell structure using resistive memory cells, it can be applied more generally, such as embodiments based on programmable threshold devices including a NAND structure of two or more memory cells. FIG. 22 illustrates an example of a more general arrangement.

FIG. 22 is a schematic representation of storing a multi-bit weight in a non-volatile array for use in an in-array inferencing operation. More specifically, FIG. 22 shows one input, such as a differential word line pair, applied to a set of multi-bit weights as part of a matrix multiplication, where two weights ($W_I$ and $W_j$) of N bits are shown. By placing multiple binary unit synapse formed of non-volatile memory cells along a row of an array, the weights can be represented with higher precision. The N bits of $W_1$, for example, are here notated as ($W^N_1, \ldots, W^2_1, W^1_1$) in the order of most significant bit (superscript bit N) to least significant bit (superscript bit 1) and are represented as arranged along the bit lines in that order, but other embodiments can arrange the weights and the individual bits of the weights differently, such as interleaving bits from different weights. In the following, a storage unit will refer to a group or set of multiple storage elements storing an N-bit weight, each of the bits being stored in a binary storage element. Additionally, the input lines for the weights for embodiments based on a differential memory cell, as illustrated in FIG. 10, corresponds to a pair of word lines upon which a differential input is applied.

When the input In is applied to the row of weights, the outputs ($O^N_1, \ldots, O^2_1, O^1_1$) from each of the bit lines ($BL^N_1, \ldots, BL^2_1, BL^1_1$) are weighted according to the significance of the bit being stored at the weighting and summing circuit $2207_1$. Depending on the embodiment, sensing can be voltage based or current based. The weighted and combined output $O_1$ can then be sensed by the multi-bit sense amplifier, or analog to digital converter, SA/ADC $2203_1$. The counter-based digital summation circuit $DSC_1$ $1405_1$ can accumulate the input-weight multiplication operations as in the binary case using a multi-state sense amplifier.

To implement N-bit precision weights using binary non-volatile memory cells the changes, relative to the binary weight example, are just to increase the number of columns/bit lines by a factor of N and add the binary weighted summation element (2207 of FIG. 22) at the end of the bit lines. The other peripheral circuitry (i.e., write driver/decoder, read related circuitry, ADC) can stay the same. The main discussion in the following is based on the differential memory cell array and voltage based output values, as for the binary array of FIG. 14, but can applied to the more general situation illustrated with respect to FIG. 22.

Figure 23:
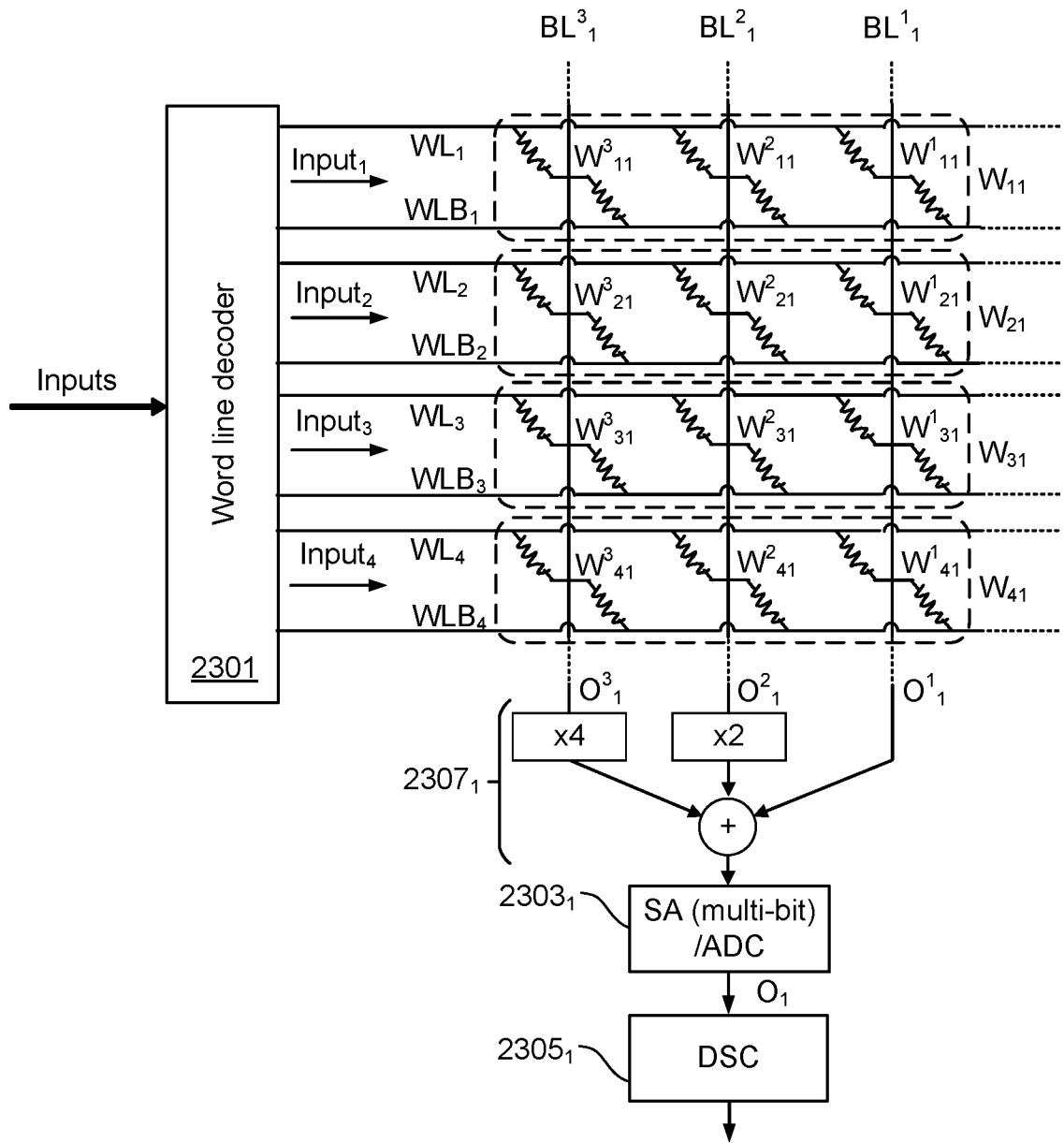
FIG. 23 illustrates the incorporation of the unit synapses of FIG. 10 into an array for a multi-bit weight embodiment.

FIG. 23 illustrates the incorporation of the unit synapses of FIG. 10 into an array for a multi-bit weight embodiment. FIG. 23 shows a 3-bit embodiment and largely repeats the elements FIG. 14, but groups the binary unit synapses and other elements of FIG. 14 into sets three for storing of 3-bit weight values and adds a weighting and summation section.

More specifically, a word line decoder 2301 receives a set of one or more inputs and converts these into the voltage patterns to be applied to the differential word line pairs, such as ($WL_1$, $WLB_1$). This can be a binary input or, more generally, other differential input. Only a single 3-bit weight is shown for each differential word line pair in FIG. 23, but a typical embodiment will include more such weighs. Focusing on the weight $W_{11}$, its most significant bit $W^3_{11}$ is connected along $BL^3_1$, its second bit $W^2_{11}$ is connected along $BL^2_1$, and its least significant bit $W^1_{11}$ is connected along $BL^1_1$. When the Input is applied to the weight $W_{11}$ as part of a matrix multiplication operation, bit lines $BL^3_1$, $BL^2_1$, and $BL^1_1$ respectively will have the output voltage levels $V_{out}{}^3_1$, $V_{out}{}^2_1$, and $V_{out}{}^1_1$. The voltage output levels $V_{out}{}^3_1$, $V_{out}{}^2_1$, and $V_{out}{}^1_1$ are then weighted based on their level of significance and combined by $2207_1$ to provide the multi-bit output $O_1$ corresponding to $In_1 * W_{11}$. The sense amplifier or ADC SA/ADC $2303_1$ senses the level of the multi-bit output $O_1$, with the results then begin accumulated in DSC $2305_1$. The multi-bit sensing and accumulation can be implemented similarly to the sensing of multiple synapses along the same bit line, as described with reference with respect to FIG. 18. Although FIG. 23 shows only one multi-bit weight per word line pair, the sensing operation can be performed concurrently for some or all of the weights connected along a word line pair.

Figure 24:
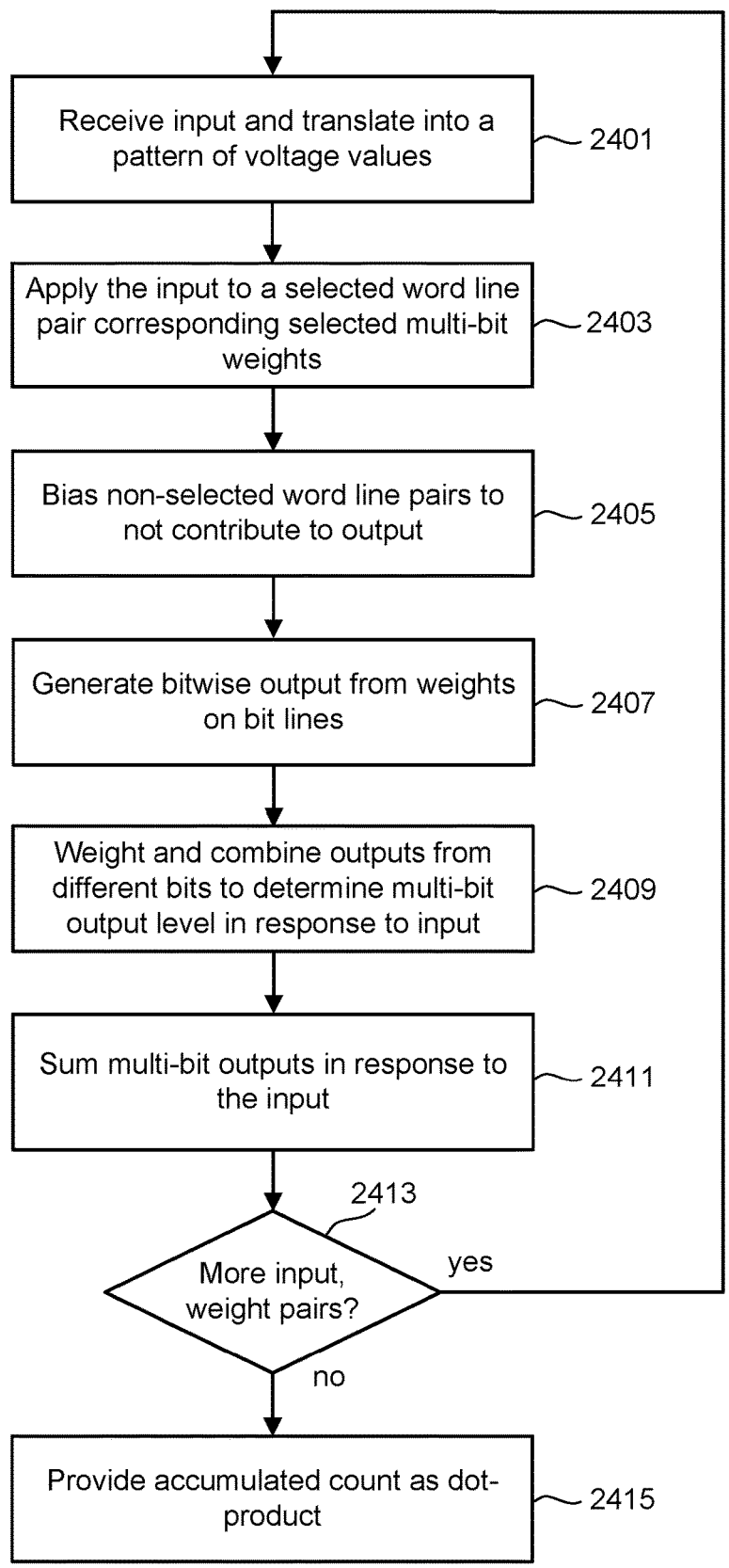
FIG. 24 is a flowchart for one embodiment of a matrix multiplication, or dot-product, calculation using multi-bit weights in inference based on the array architecture of FIG. 23.

FIG. 24 is a flowchart for one embodiment of a matrix multiplication, or dot-product, calculation using multi-bit weights during inferencing based on the array architecture of FIG. 23, extending the approach of FIG. 16 to include multi-bit weights. Beginning at step 2401, the memory array receives an input at the word line decoder 2301 and translates this into the pattern of voltage values. For a binary input, this can again correspond to a −1 or +1 input value as represented in the table of FIG. 11. Step 2403 applies the voltage levels to the selected word line pair ($WL_i$, $WLB_i$) corresponding to the unit synapses of the selected multi-bit weights. As the word lines span the bit lines of the array, the process of FIG. 24 can be performed concurrently for any of the weights connected along the word line pair ($WL_i$, $WLB_i$). Additionally, in the array structure, the unit synapses on non-selected word line pairs along the bit lines of the array are biased to not contribute to the output, such as setting both word lines of non-selected word line pairs to float, at step 2405. Although listed as an ordered set of separate steps in FIG. 24, steps 2403 and 2405 are typically performed concurrently by the word line decoder 2301.

The outputs from each of the weight's bits in response to the input are generated at step 2407. This corresponds to the voltage output levels $V_{out}{}^3_1$, $V_{out}{}^2_1$, and $V_{out}{}^1_1$ on respective bit lines $BL^3_1$, $BL^2_1$, and $BL^1_1$ in the voltage based determination of FIG. 23. The contributions from the individual bits are then weighted and combined in elements $2307_1$, and then supplied to SA $2303_1$ to determine the multi-bit output of the weight in response to the input at step 2409. Based on the state of the weight, at step 2411 the value of count of the corresponding DSC $2305_j$ is either incremented or decremented based on the multi-bit output $O_j$.

Step 2413 determines if there are more input-weight pairs to add to the matrix multiplication, or dot-product, and, if so, the flow loops back to step 2401. Once the contributions of all of the input, weight pairs to the dot products have been determined, the dot product can be provided at step 2415. The set of dot-products determined at step 2415 can then serve as the input to a subsequent neural network layer or be the output from the last layer of the inference process.

As illustrated with respect to FIGS. 23 and 24, the combining of multiple ones of the binary unit synapses of FIG. 10 allows for the memory array store the weights with higher precession, whether for the shown 3-bit embodiment, for a 2-bit embodiment, or for higher bit embodiments. With respect to the input values, these can again be a binary input, such as illustrated with respect to the table of FIG. 11 or a more general differential input. Although the embodiment of FIG. 23 is based on the differential memory cell synapse structure, the process of FIG. 24 is similarly applicable to the more general situation represented in FIG. 22, where other synapse cell structure with a voltage based or current based output of input vector-weight matrix multiplication.

As with the binary weight case, multiple inputs can be applied to the array concurrently to increase the level of parallelism, with the combined outputs on the bit lines being a bit-by-bit addition of the results of the input vector-weight matrix multiplication for the applied inputs. The flow of FIG. 25 extends the flow of FIG. 24 to the multiple concurrent input embodiment, and also corresponds to the multi-bit weight extension of the flow of FIG. 19.

FIG. 25 is a flowchart for one embodiment of a dot-product calculation performed similarly to that of FIG. 24, but that incorporates the parallelism of applying multiple inputs to the multi-bit weights concurrently. Relative to step 2401, the parallel sensing of step 2501 can now apply multiple inputs concurrently in each loop. At step 2503, the bit-wise outputs along the different word lines are determined. For example, referring back to FIG. 23, if Input$_1$, Input$_2$, Input$_3$, and Input$_4$ are applied concurrently, bit line $BL^3_1$ will include the contributions of the most significant bits $W^4_{11}$, $W^4_{12}$, $W^4_{13}$, and $W^4_{14}$. These bit-wise contributions are then weighted, combined, and supplied to the sense amplifiers at step 2505.

At step 2507, the output determined by the sense amplifier or ADC 2303$_1$ is now a multi-bit value and corresponds to the to the combined product of all the currently applied inputs with the multi-bit weights. The multi-bit value is accumulated at step 2509. The flow then determines whether there are more inputs at step 2511 and, if so, loops back to step 2501. Once all of the input/weight combinations have been determined, the flow then goes from step 2511 to 2513, providing the accumulated count as the result of the matrix multiplication.

Figure 26:
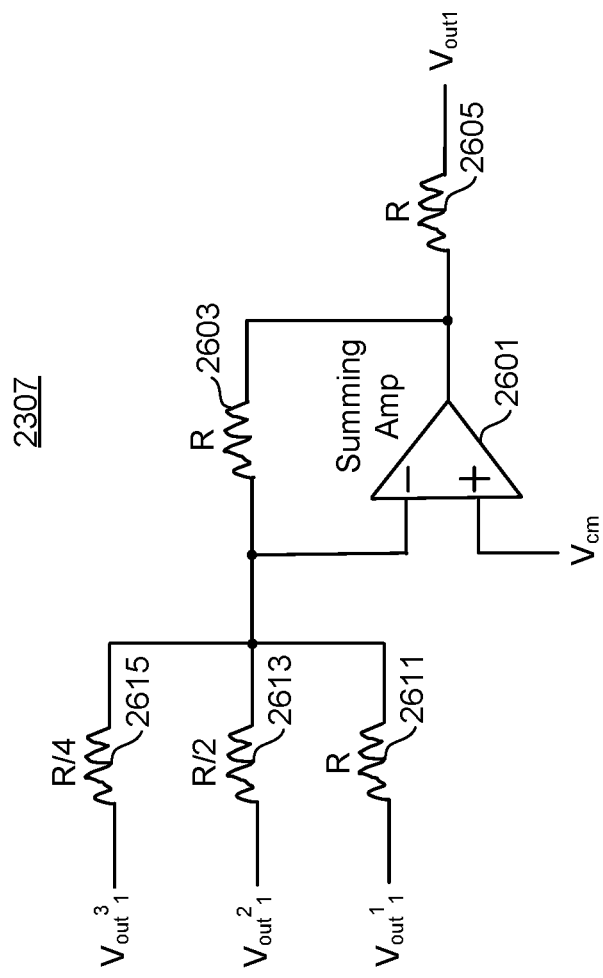
FIG. 26 illustrates an embodiment for a binary weighted voltage summation circuit that can be used for the weighting and combining of the bit-wise output of the in-array matrix multiplication operation.
Figure 27:
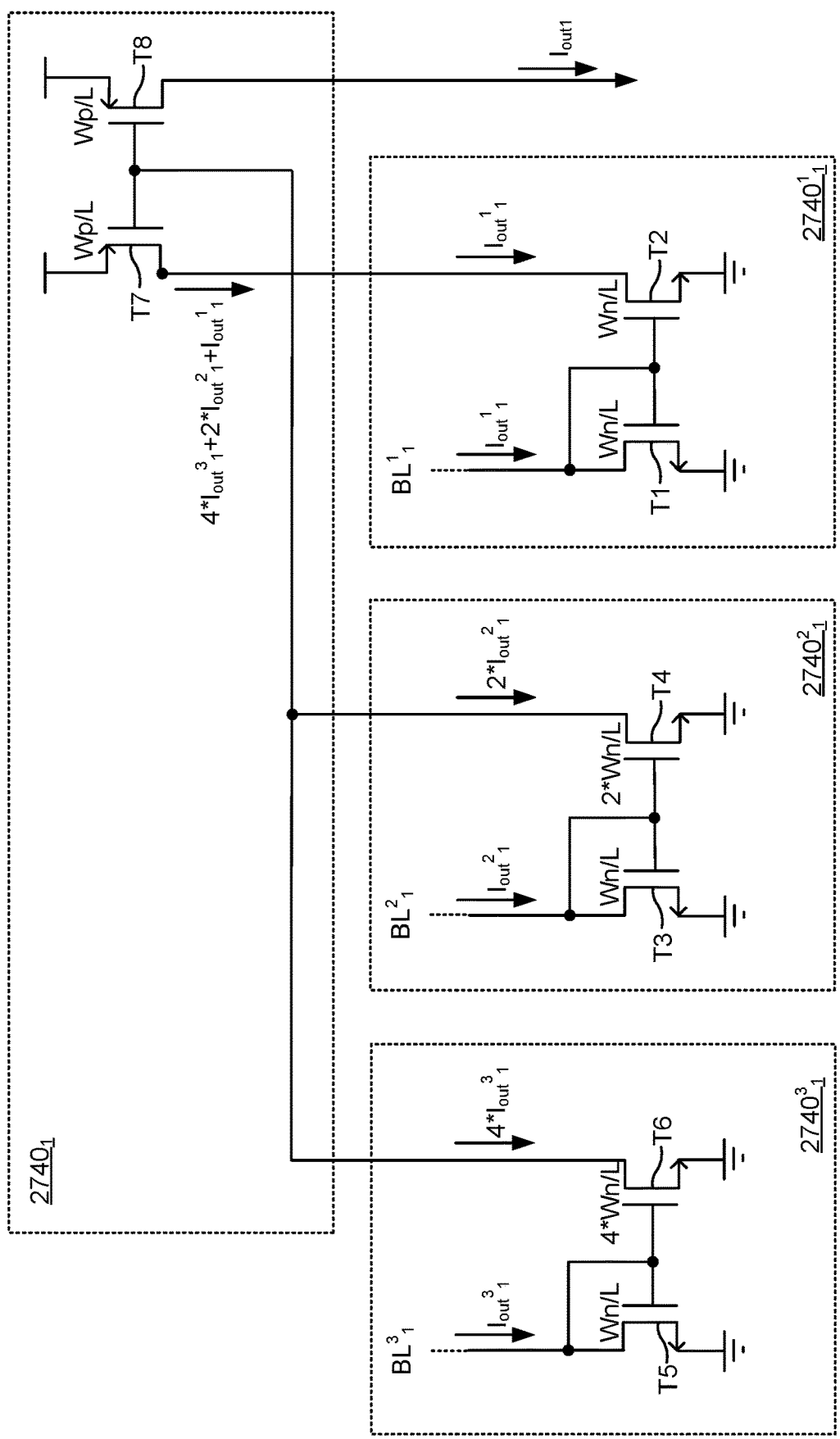
FIG. 27 is a schematic diagram of one embodiment of a current-based weighting and summing circuit that can be used for the weighting and combining of the bit-wise output of the in-array matrix multiplication operation.

Referring back to FIGS. 22 and 23, these include a weighting and summing circuit 2207$_j$ and 2307$_j$ for weighting the output levels on the different bit lines according to their significance and combining the result. FIG. 26 illustrates an embodiment of such a circuit for a voltage based summation and FIG. 27 illustrates such a circuit for a current based summation.

FIG. 26 illustrates an embodiment for a binary weighting and summing circuit 2307$_1$ circuit of FIG. 23 that can be used for the weighting and combining of the bit-wise output of the in-array matrix multiplication operation of FIG. 23. For the 3-bit embodiment, the voltage output levels $V^3_{out\,1}$, $V^2_{out\,1}$, and $V^1_{out\,1}$ on respective bit lines $BL^3_1$, $BL^2_1$, and $BL^1_1$ are each supplied through a corresponding resistor 2615, 2613, and 2611. The relative values for the resistors 2615, 2613, and 2611 are selected to weight the inputs based on their relevance, where if 2611 has a value R, then 2613 is R/2 and 2615 is R/4. More generally, each bit of significance i will be supplied though a resistance with a value of $R/2^{(i-1)}$.

The weighted output voltages are supplied to the − input of the summing amplifier 2601, which also receives a reference voltage $V_{cm}$ at the + input. A feedback loop with the base resistor value R 2603 connects the output of the summing amplifier 2601 back to the − input and the output of the summing amplifier 2601 supplies the weighted and summed output $V_{out1}$ through the resistance R 2605. The resultant output from the weighting and summing circuit 2307 of FIG. 26 is:

$$V_{out1} = V_{cm} - (4*V^3_{out\,1} + 2*V^2_{out\,1} + 1*V^1_{out\,1}).$$

Referring again to FIG. 23, the $V_{out1}$ from 2307$_1$ is then the input of the multi-bit sense amplifier SA 2307$_1$.

The discussion above was mainly described with respect to a voltage-based determination for the outputs, where an embodiment of a weighting and summing circuit 2307$_1$ is presented in FIG. 26. Other embodiments can use a current-based determination for the outputs, where an embodiment of a current based weighting and summing circuit 2307$_1$ is presented in FIG. 27.

FIG. 27 is a schematic diagram of one embodiment of a current-based weighting and summing circuit that can used to implement element 2307$_1$ of FIG. 23. The embodiment of FIG. 27 includes a set of multiply current mirrors 2740$^1_1$, 2740$^2_1$, and 2740$^3_1$ configured to weight the outputs corresponding to the different bits of the weight $W_{11}$ and a summing current mirror 2740$_1$ to sum these results. The first, second, and third multiply current mirrors 2740$^1_1$, 2740$^2_1$, and 2740$^3_1$ each receive a current from a corresponding one of the bit lines $BL^1_1$, $BL^2_1$, and $BL^3_1$ of FIG. 23.

The first multiply current mirror 2740$^1_1$ has transistors T1 and T2, the second current mirror 2740$^2$, has transistors T3 and T4, the third current mirror 2740$^3_1$ has transistors T5 and T6, and the summing current mirror 2740 alas transistors T7 and T8. In the embodiment of FIG. 27, the weighting of the different inputs to account for their relative significance is implemented through the relative sizing of the pair transistors in each of the multiply current mirrors. Taking the NMOS transistor T1 with the width-to-length ratio $W_n/L$, the other transistors of the multiply current mirrors can have their transistors sized relative to T1. To provide a 1:1 ratio in the first multiply current mirror 2740$^1_1$ has transistor T2 is sized the same as T1, $W_n/L$. To provide a 2:1 current ratio for the second current mirror 2740$^2$, transistor T3 can again be sized as $W_n/L$ and transistor T4 can be sized as $2W_n/L$. Similarly, the third current mirror 2740$^3_1$ can size transistor T5 as $W_n/L$ and transistor T6 as $4W_n/L$ to provide a 4:1 current ratio. More generally, if bits of higher significance are included, the ratio of the width-to-length ratios between the mirroring transistors would be $2^{(i-1)}W_n/L$ to $W_n/L$ for a bit of significance i.

To perform the summing operation of the weighted currents from the multiply current mirrors 2740$^1_1$, 2740$^2_1$, and 2740$^3_1$, the PMOS transistor T7 of the summing current mirror 2740$_1$ collectively supplies currents to T2, T4, and T6, such that the current through T7 is the sum of the weighted currents: $4*I^3_{out\,1} + 2*I^2_{out\,1} + 1*I^1_{out\,1}$. The PMOS transistor T7 is diode connected and has its control gate commonly connected with the control gate of PMOS transistor T8 in a current mirror arrangement. The output current hut through transistor T8 will be proportional to the current through transistor T7, where the proportionality will be based on their relative sizing and can be chosen depending on the properties of the sense amplifier 2305$_1$. For example, if both of T7 and T8 are sized as $W_p/L$, then $I_{out1} = 4*I^3_{out\,1} + 2*I^2_{out\,1} + 1*I^1_{out\,1}$.

Once the currents corresponding to the different bits of a weight are weighted and combined, the combined current level can then be provided to a multi-bit current-based sense amplifier SA 2305$_1$ to determine its contribution to the input vector-weight matrix multiplication. For both current-based implementations, as in FIG. 27, and voltage based implementations, as in FIG. 26, the multi-bit output can determine all of the bits in parallel, sequentially on a bit-by-bit basis, or a combination of the two approaches.

According to a first set of aspects, a non-volatile memory circuit includes an array of one or more storage units connected along one or more first input lines and each configured to store an N bit weight of neural network and one or more control circuits connected to the array of storage units. N is an integer greater than 1, and each of the storage units includes N non-volatile binary storage elements connected to a corresponding output line and configured to store one bit of the N bit weight. The one or more control circuits are configured to: apply a first input of a neural network to the one or more first input lines to generate an output voltage level on each of the output lines connected to a first of the storage units in response thereto; individually weight the output voltage levels generated in response to the first input on each of the output lines according to a significance of the bit of the weight stored in the binary storage element of the first storage unit corresponding to the output line; and determine a multi-bit value for the response of the weight stored in the first storage unit to the first input from a combination of the individually weighted output voltages to thereby perform an in-array multiplication of the first input with the weight stored in the first storage unit.

Further aspects include a method that includes receiving a plurality of input values for a neural network and translating each of the plurality of input values into a corresponding first voltage pattern, each first voltage pattern being one of a plurality of voltage patterns comprising a pair of voltage values. The plurality of first voltage patterns are applied to one or more pairs of word lines, each pair of word lines connected to a first set of N pairs of non-volatile memory cells storing an N-bit weight value of the neural network, each pair of memory cells of each first set storing a bit of the weight value and comprising a first memory cell connected between a first word line of the word line pair and a corresponding bit line and a second memory cell connected between a second word line of the word line pair and the corresponding bit line. The method further includes weighting an output level on each of the bit lines corresponding to the pair of memory cells of each first set in response to the applied first voltage patterns according to a significance of the bit stored in the corresponding pair of memory cells, and combining the weighted output levels to determine a multi-bit value for one or more products of the one or more input values with the one or more weight values.

In additional aspects, an apparatus comprises an array of non-volatile memory cells and one or more control circuits connected to the array of non-volatile memory cells. The array of non-volatile memory cells includes a plurality of N first bit lines, a first word line pair and a first group of N non-volatile memory cell pairs. A first memory cell of each pair of the first group is connected between a first word line of the first word line pair and a corresponding one of the first bit lines; and a second memory cell of each pair of the first group is connected between a second word line of the first word line pair and the corresponding one of the first bit lines. The one or more control circuits are configured to: receive a first input and apply a first voltage pattern corresponding to the first input to the first word line pair; individually weight an output level on each of the N first bit lines in response to applying the first voltage pattern to the first word line pair; combine the individually weighted output levels to form a weighted response of the first group of memory cells to the first input; and determine a multi-bit value for the weighted response of the first group of memory cells to the first input.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. h It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory circuit, comprising:
an array of one or more storage units connected along one or more first input lines and each configured to store an N bit weight of neural network, where N is an integer greater than 1, each of the storage units comprising N non-volatile binary storage elements connected to a corresponding output line and configured to store one bit of the N bit weight; and
one or more control circuits connected to the array of storage units, the one or more control circuits configured to:
apply a first input of a neural network to the one or more first input lines to generate an output voltage level on each of the output lines connected to a first of the storage units in response thereto;
individually weight the output voltage levels generated in response to the first input on each of the output lines according to a significance of the bit of the weight stored in the binary storage element of the first storage unit corresponding to the output line; and
determine a multi-bit value for the response of the weight stored in the first storage unit to the first input from a combination of the individually weighted output voltages to thereby perform an in-array multiplication of the first input with the weight stored in the first storage unit.

2. The non-volatile memory circuit of claim 1, wherein:
the array further comprises a second storage unit connected along one or more second input lines and configured to store an N bit weight of neural network, the second storage unit comprising N non-volatile binary storage elements connected to a corresponding output line and configured to store one bit of the N bit weight, wherein for each of the binary storage elements of a given significance of the second storage unit is connected to the same output line as the binary storage elements of a same significance of the first storage unit; and the one or more control circuits are further configured to:
apply a second input of the neural network to the one or more second input lines to generate an output voltage level on each of the output lines connected to the second storage unit in response thereto;
individually weight the output voltage levels generated in response to the second input on each of the output lines according to the significance of the bit of the weight stored in the binary storage element of the second storage unit corresponding to the output line; and
determine a multi-bit value for the response of the weight stored in the second storage unit to the second input from a combination of the individually weighted output voltages generated in response to the second input to thereby perform an in-array multiplication of the second input with the weight stored in the second storage unit.

3. The non-volatile memory circuit of claim 2, wherein the one or more control circuits are further configured to:
accumulate the multi-bit value for the response of the weight stored in the first storage unit to the first input and the multi-bit value for the response of the weight stored in the second storage unit to the second input.

4. The non-volatile memory circuit of claim 3, wherein the one or more control circuits are further configured to:
apply the second input of the neural network to the second input lines concurrently with applying the first input of the neural network to the first input lines.

5. The non-volatile memory circuit of claim 3, wherein the one or more control circuits are further configured to:
apply the second input of the neural network to the second input lines sequentially with applying the first input of the neural network to the first input lines.

6. The non-volatile memory circuit of claim 3, wherein the one or more control circuits are further configured to:
concurrently with applying the first input to the first input lines to generate the output voltage level on each of the output lines connected to the first of the storage units in response thereto, apply the first input to the first input lines to generate an output voltage level on each of the output lines connected to a second of the storage units in response thereto;
individually weight the output voltage levels generated in response to the first input on each of the output lines according to a significance of the bit of the weight stored in the binary storage element of the second storage unit corresponding to the output line; and
determine a multi-bit value for the response of the weight stored in the second storage unit to the first input from a combination of the individually weighted output voltages to thereby perform an in-array multiplication of the first input with the weight stored in the second storage unit.

7. The non-volatile memory circuit of claim 1, wherein:
one or more first input lines are a pair of first word lines;
each of the binary storage elements includes a pair of memory cells each connected between the corresponding output line and one of the first word lines;
and the first input is applied to the pair of first word lines as one of a plurality of voltage patterns.

8. The non-volatile memory circuit of claim 7, wherein the memory cells include phase change memory (PCM) based memory cells.

9. The non-volatile memory circuit of claim 7, wherein the array of storage is formed according to a cross-point architecture as part of a monolithic three-dimensional semiconductor memory device where the memory cells are arranged in multiple physical levels above a substrate.

10. A method, comprising:
receiving a plurality of input values for a neural network;
translating each of the plurality of input values into a corresponding first voltage pattern, each first voltage pattern being one of a plurality of voltage patterns comprising a pair of voltage values;
applying the plurality of first voltage patterns to one or more pairs of word lines, each pair of word lines connected to a first set of N pairs of non-volatile memory cells storing an N-bit weight value of the neural network, each pair of memory cells of each first set storing a bit of the weight value and comprising a first memory cell connected between a first word line of the word line pair and a corresponding bit line and a second memory cell connected between a second word line of the word line pair and the corresponding bit line;
weighting an output level on each of the bit lines corresponding to the pair of memory cells of each first set in response to the applied first voltage patterns according to a significance of the bit stored in the corresponding pair of memory cells; and
combining the weighted output levels to determine a multi-bit value for one or more products of the one or more input values with the one or more weight values.

11. The method of claim 10, wherein:
applying the plurality of first voltage patterns to one or more pairs of word lines includes applying the plurality of first voltage patterns sequentially to a corresponding plurality of the word line pairs; and
weighting the output levels on the bit lines in response to the applied plurality of first voltage patterns sequentially.

12. The method of claim 10, wherein:
applying the plurality of first voltage patterns to one or more pairs of word lines includes applying the plurality of first voltage patterns concurrently to a corresponding plurality of the word line pairs; and
weighting the output levels on the bit lines in response to the applied plurality of first voltage patterns concurrently.

13. The method of claim 10, wherein each pair of word lines is further connected to a second set of N pairs of non-volatile memory cells storing an N-bit weight value of the neural network, each pair of memory cells of each second set storing a bit of the weight value and comprising a first memory cell connected between a first word line of the word line pair and a corresponding bit line and a second memory cell connected between a second word line of the word line pair and the corresponding bit line, the method further comprising:
weighting the output levels on the bit lines corresponding to the pair of memory cells of each second set in response to the applied first voltage patterns according to a significance of the bit stored in the corresponding pair of memory cells.

14. An apparatus, comprising:
an array of non-volatile memory cells, including a plurality of N first bit lines, a first word line pair and a first group of N non-volatile memory cell pairs, a first memory cell of each pair of the first group connected between a first word line of the first word line pair and a corresponding one of the first bit lines and a second memory cell of each pair of the first group connected between a second word line of the first word line pair and the corresponding one of the first bit lines; and one or more control circuits connected to the array of non-volatile memory cells, the one or more control circuits configured to:

receive a first input and apply a first voltage pattern corresponding to the first input to the first word line pair;

individually weight an output level on each of the N first bit lines in response to applying the first voltage pattern to the first word line pair;

combine the individually weighted output levels to form a weighted response of the first group of memory cells to the first input; and determine a multi-bit value for the weighted response of the first group of memory cells to the first input.

15. The apparatus of claim 14, wherein the output levels are current levels and the one or more control circuits include a current mirror configured to weight the output level on each of the N first bit lines.

16. The apparatus of claim 15, wherein the current mirror is configured to implement weighting of the output level through relative sizing of transistors in the current mirror.

17. The apparatus of claim 14, wherein the output levels are voltage levels and the one or more control circuits include a voltage summation circuit to combine the individually weighted output levels.

18. The apparatus of claim 14, wherein the array of non-volatile memory cells is formed according to a cross-point architecture as part of a monolithic three-dimensional semiconductor memory device where the memory cells are arranged in multiple physical levels above a substrate.

19. The apparatus of claim 14, wherein:

the array of non-volatile memory cells further includes a second word line pair and a second group of N non-volatile memory cell pairs, a first memory cell of each pair of the second group connected between a first word line of the second word line pair and a corresponding one of the first bit lines and a second memory cell of each pair of the second group connected between a second word line of the second word line pair and the corresponding one of the first bit lines; and the one or more control circuits are further configured to:

receive a second input and apply a second voltage pattern corresponding to the second input to the second word line pair;

individually weight an output level on each of the N first bit lines in response to applying the second voltage pattern to the second word line pair;

combine the individually weighted output levels to form a weighted response of the second group of memory cells to the second input;

determine a multi-bit value for the weighted response of the second group of memory cells to the second input; and accumulate the multi-bit value for the weighted response of the second group of memory cells to the second input with the multi-bit value for the weighted response of the first group of memory cells to the first input.

20. The apparatus of claim 19, wherein the one or more control circuits are further configured to:

apply the second voltage pattern to the second word line pair concurrently with applying the first voltage pattern to the first word line pair; and individually weight the output level on each of the N first bit lines in response to concurrently applying the second voltage pattern to the second word line pair and of the first voltage pattern to the first word line pair.

\* \* \* \* \*